(12) United States Patent
Pushkarsky et al.

(10) Patent No.: US 8,774,244 B2
(45) Date of Patent: Jul. 8, 2014

(54) THERMAL POINTER

(75) Inventors: Michael Pushkarsky, San Diego, CA (US); David F. Arnone, Mountain View, CA (US); Matt Barre, Cardiff, CA (US); David P. Caffey, San Diego, CA (US); Salvatore F. Crivello, Poway, CA (US); Timothy Day, Poway, CA (US); Kyle Thomas, Weston, FL (US)

(73) Assignee: Daylight Solutions, Inc., San Diego, CA (US)

(*) Notice: Subject to any disclaimer, the term of this patent is extended or adjusted under 35 U.S.C. 154(b) by 172 days.

(21) Appl. No.: 13/303,088

(22) Filed: Nov. 22, 2011

(65) Prior Publication Data

US 2012/0106160 A1 May 3, 2012

Related U.S. Application Data

(63) Continuation-in-part of application No. 12/427,364, filed on Apr. 21, 2009, now Pat. No. 8,306,077.

(60) Provisional application No. 61/416,237, filed on Nov. 22, 2010.

(51) Int. Cl.
*H01S 5/00* (2006.01)

(52) U.S. Cl.
USPC ............ 372/50.12; 372/50.121; 372/50.122; 372/50.23; 362/259

(58) Field of Classification Search
USPC ................ 372/50.12, 50.121, 50.122, 50.23; 362/259
See application file for complete search history.

(56) References Cited

U.S. PATENT DOCUMENTS

| | | | |
|---|---|---|---|
| 2,684,015 A | 7/1954 | Grey | |
| 3,782,832 A | 1/1974 | Hacskaylo | |
| 4,266,873 A | 5/1981 | Hacskaylo | |
| 4,470,662 A | 9/1984 | Mumzhiu | |
| 4,555,627 A | 11/1985 | McRae, Jr. | |
| 4,656,641 A | 4/1987 | Scifres et al. | |
| 4,737,028 A | 4/1988 | Smith | |

(Continued)

FOREIGN PATENT DOCUMENTS

| | | |
|---|---|---|
| DE | 10205310 A1 | 9/2003 |
| EP | 0877 454 A1 | 11/1998 |

(Continued)

OTHER PUBLICATIONS

Hildebrandt, L. et al.. "Quantum cascade external cavity laser systems in the mid-infrared spectral range," 2004, Sacher Lasertechnik Group, Marburg, Germany.

(Continued)

*Primary Examiner* — Yuanda Zhang
(74) *Attorney, Agent, or Firm* — Roeder & Broder LLP

(57) ABSTRACT

A laser source assembly for providing an assembly output beam includes a first emitter, a second emitter, and a third emitter. The first emitter emits a first beam along a first beam axis that is substantially parallel to and spaced apart from an assembly axis. The second emitter emits a second beam along a second beam axis that is substantially parallel to and spaced apart from the assembly axis. The third emitter emits a third beam along a third beam axis that is substantially parallel to and spaced apart from the assembly axis. The first beam axis, the second beam axis and the third beam axis are positioned spaced apart about and substantially equidistant from the assembly axis.

24 Claims, 18 Drawing Sheets

(56) References Cited

U.S. PATENT DOCUMENTS

| | | |
|---|---|---|
| 4,745,276 A | 5/1988 | Broicher et al. |
| 4,772,789 A | 9/1988 | Maram et al. |
| 4,796,266 A | 1/1989 | Banwell et al. |
| 4,852,956 A | 8/1989 | Kramer |
| 4,871,916 A | 10/1989 | Scott |
| 5,005,934 A | 4/1991 | Curtiss |
| 5,050,176 A | 9/1991 | Naito et al. |
| 5,056,097 A | 10/1991 | Meyers |
| 5,064,988 A | 11/1991 | E'nama et al. |
| 5,068,867 A | 11/1991 | Hasenberg et al. |
| 5,082,339 A | 1/1992 | Linnebach |
| 5,082,799 A | 1/1992 | Holmstrom et al. |
| 5,118,186 A | 6/1992 | Schraetzenstaller et al. |
| 5,140,599 A | 8/1992 | Trutna, Jr. et al. |
| 5,161,408 A | 11/1992 | McRae et al. |
| 5,172,390 A | 12/1992 | Mooradian |
| 5,181,214 A | 1/1993 | Berger et al. |
| 5,208,417 A | 5/1993 | Langer et al. |
| 5,225,679 A | 7/1993 | Clarke et al. |
| 5,255,073 A | 10/1993 | Wallin et al. |
| 5,264,368 A | 11/1993 | Clarke et al. |
| 5,315,436 A | 5/1994 | Lowenhar et al. |
| 5,331,651 A | 7/1994 | Becker et al. |
| 5,355,609 A | 10/1994 | Schenke |
| 5,430,293 A | 7/1995 | Sato et al. |
| 5,457,709 A | 10/1995 | Capasso et al. |
| 5,476,385 A | 12/1995 | Parikh et al. |
| 5,491,714 A | 2/1996 | Kitamura |
| 5,523,569 A | 6/1996 | Hornfeld et al. |
| 5,537,432 A | 7/1996 | Mehuys et al. |
| 5,656,813 A | 8/1997 | Moore et al. |
| 5,662,819 A | 9/1997 | Kadomura |
| 5,671,561 A | 9/1997 | Johnson et al. |
| 5,685,636 A | 11/1997 | German |
| 5,751,830 A | 5/1998 | Hutchinson |
| 5,752,100 A | 5/1998 | Schrock |
| 5,780,724 A | 7/1998 | Olender et al. |
| 5,824,884 A | 10/1998 | Olender et al. |
| 5,834,632 A | 11/1998 | Olender et al. |
| 5,854,422 A | 12/1998 | McKeon et al. |
| 5,862,162 A | 1/1999 | Maeda |
| 5,866,073 A | 2/1999 | Sausa et al. |
| 5,892,617 A | 4/1999 | Wallace |
| 6,089,076 A | 7/2000 | Mueller et al. |
| 6,115,396 A * | 9/2000 | Connors .................. 372/30 |
| 6,134,257 A | 10/2000 | Capasso et al. |
| 6,154,307 A | 11/2000 | Veronesi et al. |
| 6,157,033 A | 12/2000 | Chudnovsky |
| 6,192,064 B1 | 2/2001 | Algots et al. |
| 6,243,404 B1 | 6/2001 | Joyce |
| 6,326,646 B1 | 12/2001 | Baillargeon et al. |
| 6,327,896 B1 | 12/2001 | Veronesi et al. |
| 6,363,648 B1 | 4/2002 | Kranich et al. |
| 6,400,744 B1 | 6/2002 | Capasso et al. |
| 6,431,732 B1 | 8/2002 | Brown et al. |
| 6,470,036 B1 | 10/2002 | Bailey et al. |
| 6,483,978 B1 | 11/2002 | Gao et al. |
| 6,553,045 B2 | 4/2003 | Kaspi |
| 6,575,641 B2 | 6/2003 | Yamabayashi et al. |
| 6,578,311 B2 | 6/2003 | Danielson et al. |
| 6,608,847 B2 | 8/2003 | Zhang et al. |
| 6,616,452 B2 | 9/2003 | Clark et al. |
| 6,636,539 B2 | 10/2003 | Martinsen |
| 6,678,429 B2 | 1/2004 | Mossberg et al. |
| 6,690,472 B2 | 2/2004 | Kulp et al. |
| 6,714,564 B1 | 3/2004 | Meyers |
| 6,782,162 B2 | 8/2004 | Fukuzawa et al. |
| 6,803,577 B2 | 10/2004 | Edner et al. |
| 6,823,115 B2 | 11/2004 | Greiner et al. |
| 6,829,417 B2 | 12/2004 | Greiner et al. |
| 6,856,717 B2 | 2/2005 | Kilian |
| 6,859,318 B1 | 2/2005 | Mossberg |
| 6,859,481 B2 | 2/2005 | Zheng |
| 6,866,089 B2 | 3/2005 | Avila |
| 6,879,441 B1 | 4/2005 | Mossberg |
| 6,885,965 B2 | 4/2005 | Butler et al. |
| 6,909,539 B2 | 6/2005 | Korniski et al. |
| 6,961,491 B2 | 11/2005 | Greiner et al. |
| 6,965,464 B2 | 11/2005 | Mossberg |
| 6,965,716 B2 | 11/2005 | Greiner et al. |
| 6,985,656 B2 | 1/2006 | Iazikov et al. |
| 6,987,911 B2 | 1/2006 | Mossberg et al. |
| 6,990,276 B2 | 1/2006 | Brice et al. |
| 6,993,223 B2 | 1/2006 | Greiner et al. |
| 6,995,846 B2 | 2/2006 | Kalayeh et al. |
| 7,009,743 B2 | 3/2006 | Mossberg |
| 7,032,431 B2 | 4/2006 | Baum et al. |
| 7,051,469 B1 | 5/2006 | Pochapsky et al. |
| 7,054,517 B2 | 5/2006 | Mossberg et al. |
| 7,061,022 B1 | 6/2006 | Pham et al. |
| 7,062,128 B2 | 6/2006 | Mossberg |
| 7,063,260 B2 | 6/2006 | Mossberg et al. |
| 7,088,076 B2 | 8/2006 | Densham et al. |
| 7,116,453 B2 | 10/2006 | Mossberg |
| 7,120,334 B1 | 10/2006 | Greiner et al. |
| 7,123,794 B2 | 10/2006 | Greiner et al. |
| 7,151,787 B2 | 12/2006 | Kulp et al. |
| 7,181,103 B1 | 2/2007 | Greiner et al. |
| 7,189,970 B2 | 3/2007 | Racca et al. |
| 7,190,856 B1 | 3/2007 | Iazikov et al. |
| 7,190,858 B1 | 3/2007 | Greiner et al. |
| 7,190,859 B2 | 3/2007 | Greiner et al. |
| 7,194,164 B2 | 3/2007 | Iazikov et al. |
| 7,203,401 B2 | 4/2007 | Mossberg et al. |
| 7,224,855 B2 | 5/2007 | Iazikov et al. |
| 7,224,867 B2 | 5/2007 | Mossberg |
| 7,231,862 B1 | 6/2007 | Quinn |
| 7,260,290 B1 | 8/2007 | Greiner et al. |
| 7,265,842 B2 | 9/2007 | Paldus et al. |
| 7,286,732 B2 | 10/2007 | Greiner et al. |
| 7,292,755 B1 | 11/2007 | Greiner et al. |
| 7,325,318 B2 | 2/2008 | Roes |
| 7,325,354 B2 | 2/2008 | Grauslys et al. |
| 7,327,908 B1 | 2/2008 | Iazikov et al. |
| 7,330,614 B1 | 2/2008 | Mossberg et al. |
| 7,333,692 B1 | 2/2008 | Mossberg et al. |
| 7,341,189 B2 | 3/2008 | Mossberg et al. |
| 7,345,277 B2 | 3/2008 | Zhang |
| 7,349,599 B1 | 3/2008 | Iazikov et al. |
| 7,358,498 B2 | 4/2008 | Geng et al. |
| 7,359,597 B1 | 4/2008 | Iazikov et al. |
| 7,424,042 B2 | 9/2008 | Day et al. |
| 7,429,734 B1 | 9/2008 | Tidwell |
| 7,466,734 B1 | 12/2008 | Day et al. |
| 7,490,430 B2 | 2/2009 | Staley |
| 7,492,806 B2 | 2/2009 | Day et al. |
| 7,505,119 B2 | 3/2009 | Rogers |
| 7,535,656 B2 | 5/2009 | Day et al. |
| 7,535,936 B2 | 5/2009 | Day et al. |
| 7,559,169 B2 | 7/2009 | Hung et al. |
| 7,590,316 B2 | 9/2009 | Dames |
| 7,623,234 B2 | 11/2009 | Puzey |
| 7,732,767 B2 | 6/2010 | Houde-Walter |
| 7,733,925 B2 | 6/2010 | Pushkarsky et al. |
| 7,753,549 B2 | 7/2010 | Solinsky et al. |
| 7,755,041 B2 | 7/2010 | Killinger et al. |
| 7,796,341 B2 | 9/2010 | Day et al. |
| 7,818,911 B2 | 10/2010 | Houde-Walter et al. |
| 7,826,503 B2 | 11/2010 | Day et al. |
| 7,848,382 B2 | 12/2010 | Weida et al. |
| 7,873,094 B2 | 1/2011 | Day et al. |
| 7,920,608 B2 | 4/2011 | Marsland, Jr. et al. |
| 8,027,094 B2 | 9/2011 | Day et al. |
| 8,050,307 B2 | 11/2011 | Day et al. |
| 8,068,521 B2 | 11/2011 | Weida et al. |
| 2002/0024979 A1 | 2/2002 | Vilhelmsson et al. |
| 2002/0064198 A1 | 5/2002 | Koizumi |
| 2002/0090013 A1 | 7/2002 | Murry et al. |
| 2002/0105699 A1 | 8/2002 | Miracky et al. |
| 2002/0150133 A1 | 10/2002 | Aikiyo et al. |
| 2002/0176473 A1 | 11/2002 | Mouradian |
| 2003/0043877 A1 | 3/2003 | Kaspi |
| 2003/0063633 A1 | 4/2003 | Zhang et al. |
| 2003/0095346 A1 | 5/2003 | Nasu et al. |

(56) References Cited

U.S. PATENT DOCUMENTS

| | | | |
|---|---|---|---|
| 2003/0123495 A1 | 7/2003 | Cox | |
| 2003/0127596 A1 | 7/2003 | Kosterev et al. | |
| 2003/0128543 A1* | 7/2003 | Rekow | 362/259 |
| 2003/0174315 A1 | 9/2003 | Byren et al. | |
| 2003/0179789 A1 | 9/2003 | Pilgrim et al. | |
| 2003/0198274 A1 | 10/2003 | Lucchetti | |
| 2004/0013154 A1 | 1/2004 | Zheng | |
| 2004/0032891 A1 | 2/2004 | Ikeda et al. | |
| 2004/0095579 A1 | 5/2004 | Bisson et al. | |
| 2004/0165640 A1 | 8/2004 | Clifford et al. | |
| 2004/0208602 A1 | 10/2004 | Plante | |
| 2004/0228371 A1 | 11/2004 | Kolodzey et al. | |
| 2004/0238811 A1 | 12/2004 | Nakamura et al. | |
| 2004/0264523 A1 | 12/2004 | Posamentier | |
| 2005/0083568 A1 | 4/2005 | Nakae et al. | |
| 2005/0105566 A1 | 5/2005 | Sacher | |
| 2005/0199869 A1 | 9/2005 | Shi | |
| 2005/0213627 A1 | 9/2005 | Masselink et al. | |
| 2005/0237524 A1 | 10/2005 | Kamei | |
| 2006/0056466 A1 | 3/2006 | Belenky et al. | |
| 2006/0214107 A1 | 9/2006 | Mueller | |
| 2006/0239323 A1* | 10/2006 | Montagne et al. | 372/75 |
| 2006/0262316 A1 | 11/2006 | Baney | |
| 2006/0268947 A1 | 11/2006 | Kalayeh | |
| 2007/0019702 A1 | 1/2007 | Day et al. | |
| 2007/0030865 A1 | 2/2007 | Day et al. | |
| 2007/0047599 A1 | 3/2007 | Wysocki et al. | |
| 2007/0209268 A1 | 9/2007 | Birurakis et al. | |
| 2007/0291804 A1 | 12/2007 | Day et al. | |
| 2008/0075153 A1 | 3/2008 | Day et al. | |
| 2008/0112709 A1* | 5/2008 | Oulianov et al. | 398/159 |
| 2008/0231719 A1 | 9/2008 | Benson | |
| 2008/0298406 A1 | 12/2008 | Day et al. | |
| 2008/0304524 A1 | 12/2008 | Marsland et al. | |
| 2009/0015914 A1 | 1/2009 | Duncan et al. | |
| 2009/0110019 A1* | 4/2009 | Houde-Walter et al. | 372/55 |
| 2009/0159798 A1 | 6/2009 | Weida et al. | |
| 2009/0213882 A1 | 8/2009 | Weida et al. | |
| 2009/0257709 A1 | 10/2009 | Dames | |
| 2009/0262768 A1 | 10/2009 | Day et al. | |
| 2010/0110198 A1 | 5/2010 | Larson et al. | |
| 2010/0132581 A1 | 6/2010 | Day et al. | |
| 2010/0229448 A1 | 9/2010 | Houde-Walter et al. | |
| 2010/0243891 A1 | 9/2010 | Day et al. | |
| 2011/0006229 A1 | 1/2011 | Day et al. | |
| 2011/0080311 A1 | 4/2011 | Pushkarsky et al. | |
| 2011/0222566 A1 | 9/2011 | Weida et al. | |
| 2011/0233409 A1 | 9/2011 | Weida et al. | |

FOREIGN PATENT DOCUMENTS

| | | |
|---|---|---|
| EP | 883 220 A2 | 12/1998 |
| EP | 2 081 265 A3 | 9/2009 |
| EP | 2 113 975 A2 | 11/2009 |
| EP | 2256528 A1 | 12/2010 |
| GB | 2286901 A | 8/1995 |
| JP | 55087107 A | 7/1980 |
| JP | 58072108 | 4/1983 |
| JP | 03-048480 A | 3/1991 |
| JP | 07-024322 B | 1/1995 |
| JP | 2005317819 A | 11/2005 |
| WO | WO9220127 A1 | 11/1992 |
| WO | WO9321843 | 11/1993 |
| WO | WO 03/067720 A2 | 8/2003 |
| WO | WO2006045303 A2 | 5/2006 |
| WO | WO2008010966 A2 | 1/2008 |
| WO | WO2008036881 A2 | 3/2008 |
| WO | WO2008036884 A2 | 3/2008 |

OTHER PUBLICATIONS

Haim Lotem, Mode-hop suppression of Littrow grating-tuned lasers: comment, 20 Month 1994, p. 1, vol. 33, No. 00, Applied Optics.
Patrick McNicholl and Harold J. Metcalf, Synchronous cavity mode and feedback wavelength scanning in dye laser oscillators with gratings, Sep. 1, 1985, pp. 2757-2761, vol. 24, No. 17, Applied Optics, ©1985 Optical Society of America.
Corrie David Farmer, "Fab and Eval. of QCL's", Sep. 2000, Faculty of Engineering, University of Glasgow, Glasgow, UK.
M. De Labachelerie and G. Passedat, Mode-hop suppression of Littrow grating-tuned lasers, Jan. 20, 1993, pp. 269-274, vol. 32, No. 3, Applied Optics, ©1993 Optical Society of America.
S. Blaser et al., Alpes Lasers, Room-temperature continuous-wave single-mode quantum cascade lasers, Photonics West 2006, Novel In-Plane Semiconductors V:Quantum Cascade Lasers:6133-01 Switzerland.
Gaetano Scamarcio, Mid-IR and THz Quantum Cascade Lasers, 2005, Physics Dept., University of Bari, Bari Italy.
Gaetano Scamarcio et al., Micro-probe characterization of QCLs correlation with optical performance, APL 78, 1177 & APL 78, 2095 (2001), APL 2002, APL 2004, University of Bari, Ban Italy.
J. Faist, THz and Mid-IR Quantum cascade lasers, QM in space, Chatillon, Mar. 31, Science 2002, University of Neuchatel, EU Projects Answer/Teranova; Agilent, Funding Swiss National Science Foundation.
Joel M. Hensley, Recent Updates in QCL-based Sensing Applications, Sep. 5-10, 2006, Physical Sciences, Inc., Andover, MA, 2nd International Workshop on Quantum Cascade Lasers, Ostuni, Italy.
J.M. Hensley et al., Demonstration of an External Cavity Terahertz Quantum Cascade Laser, Copyright 2005, Optical Society of America, Washington, DC 20036.
L. Hildebrandt et al., Quantum cascade external cavity and DFB laser systems in the mid-infrared spectral range: devices and applications, 2004, Marburg Germany.
Richard Maulini et al., Broadly tunable external cavity quantum-cascade lasers, 2005, University of Neuchatel, Neuchatel Switzerland.
Tsekoun, A. et al; "Improved performance of QCL's through a scalable, manufacturable epitaxial-side-down mounting process"; Feb. 2006.
Pushkarsky, M. et al.; "Sub-parts-per-billion level detection of NO2 using room temp. QCLs"; May 2006.
Wirtz, D. et al.; "A tuneable heterodyne infrared spectrometer"; Physikalisches Institut; University of Koln; Koln Germany Spectrochimica 2002.
Williams, B. et al.;"Terahertz QCLs and Electronics"; PhD-MIT 2003.
EPO Extended Search Report for EP 09158585.1 dated Jan. 28, 2011, Daylight Solutions, Inc. (related to U.S. Appl. No. 12/427,364 filed Apr. 2, 2009 and published as US 2010/0111122A1 on May 6, 2010).
Holloway, Stephen A., Evolution of test and evaluation of infrared missile warning systems, Sep. 19, 2007, XP-002616657, Proc. of SPIE vol. 6737 (2007), downloaded from SPIE Digital Library on Jan. 13, 2011.
PCT/US2011/028780 filed Mar. 17, 2011, Daylight Solutions, Inc. PCT International Application No. PCT/US2011/028780 and its entire prosecution history.
PCT/US2011/43065 filed Jul. 6, 2011, Daylight Solutions, Inc. PCT International Application No. PCT/US2011/443065 and its entire prosecution history.
U.S. Appl. No. 13/177,332, filed Jul. 6, 2011, Daylight Solutions, Inc.
U.S. Appl. No. 13/177,332, filed Jul. 6, 2011 and its entire prosecution history.
U.S. Appl. No. 13/211,186, filed Aug. 16, 2011, Daylight Solutions, Inc. U.S. Appl. No. 13/211,186, filed Aug. 16, 2011 and its entire prosecution history.
U.S. Appl. No. 13/237,461, filed Sep. 20, 2011, Daylight Solutions, Inc. U.S. Appl. No. 13/237,461, filed Sep. 20, 2011 and its entire prosecution history.
U.S. Appl. No. 13/240,889, filed Sep. 22, 2011, Daylight Solutions, Inc. U.S. Appl. No. 13/240,889, filed Sep. 22, 2011 and its entire prosecution history.
U.S. Appl. No. 13/267,787, filed Oct. 6, 2011, Daylight Solutions, Inc. U.S. Appl. No. 13/267,787, filed Oct. 6, 2011 and its entire prosecution history.
Weida et al., Utilizing braod gain bandwidth in quantum cascade devices, Nov. 2010, vol. 49 (11) Optical Engineering , 111120, 0091-3286/2010 © SPIE.

(56) References Cited

OTHER PUBLICATIONS

File:LED, 5mm, green (en).svg-Wikipedia, the free encyclopdeia, Description English: A labeled drawing of a 5mm round (the "normal" type) LED. Apr. 6, 2009, 3 pages, http://en.wikipedia.org/wiki/File:LED,_5mm,_green(en).svg.
Martini, Ranier et al.,"High duty cycle operation of quantum cascade lasers based on graded superlattice active regions,"Journal of Applied Physics, Jun. 15, 2001, pp. 7735-7738,vol. 89, No. 12, XP012052642 ISSN:0021-8979, © 2001 American Institute of Physics.
Sirtori, Carlo et al.,"Mid-Infrared (8.5 µm) Semiconductor Lasers Operating at Room Temperature," IEEE Photonics Technology Letters, Mar. 1997, pp. 297-299, vol. 9, No. 3, XP000684396, ISN:1041-1135, © 1997 IEE.
W.Y. Oh et al, "115 kHz tuning repetition rate ultrahigh-speed wavelength-swept semiconductor laser", received Apr. 11, 2005, accepted Aug. 9, 2005, pp. 3159-3163, vol. 30, No. 23, Optics Letters, © 2005 Optical Society of America.
Weida et al., "Tunable QC laser opens up mid-IR sensing applications," Jul. 2006, pp. 1-5, Laser Focus World, http://www.optoiq.com/index/photonics-technologies-applications/lfw-display/lfw-articles-tools-template/_pr . . . .
G.P. Luo et al.,Grating-tuned external-cavity quantum-cascade semiconductor lasers, May 7, 2001, Applied Physics Letters, vol. 78, No. 19, © 2001 American Institute of Physics.
G. Wysocki et al.,Widely tunable mode-hop free external cavity quantum cascade laser for high resolution spectroscopic applications, Jul. 27, 2005, Applied Physics, B81, pp. 769-777, Applied Physics B Lasers and Optics.
Day et al., Miniaturized External Cavity Quantum Cascade Lasers for Broad Tunability in the Mid-Infrared, May 21, 2006, 1-55752-813-6, Lasers and Electro-Optics and 2006 Quantum Electronics and Laser Science Conference, © 2006 IEEE.
G. Totschig et al.,Mid-infrared external-cavity quantum-cascade laser XP-001161786, Oct. 15, 2002, pp. 1788-1790, Optics Letter/ vol. 27, No. 20, © 2002 Optical Society of America.
Thierry Aellen et al., Continuous-wave distributed-feedback quantum-cascade lasers on a Peltier cooler, Sep. 8, 2003, pp. 1929-1931, Applied Physics Letters, vol. 83, No. 10, © 2003 American Institute of Physics.
D. Weidmann et al., Development of a compact quantum cascade laser spectrometer for field measurements of CO 2 isotopes, Feb. 1, 2005, pp. 255-260, Applied PhysicsB, Lasers and Optics, Appl. Phys. B 80, published online: Sep. 29, 2004 © Springer-Verlag 2004.
Cassidy et al., Short-external-cavity module for enhanced single-mode tuning of InGaAsP and AlGaAs semiconductor diode lasers, Oct. 1991, No. 10, pp. 2385-2388, © 1991 American Institute of Physics.
M.G. Littman, H.J. Metcalf: "Spectrally narrow pulse dye laser without beam expander" Applied Optics, vol. 17, No. 14, Jul. 15, 1978, pp. 2224-2227, XP002528173 US.
Patrick McNicholl and Harold J. Metcalf, Synchronous cavity mode and feedback wavelength scanning in dye laser oscillators with gratings, Sep. 1, 1985, pp. 2757-2761, vol. 24, No. 17, Applied Optics, © 1985 Optical Society of America.
Victor Rudometov and Eugene Rudometrov, Peltier Coolers, May 11, 2005, pp. 1-11, http://www.digit-life.com /article/peltiercoolers.com/ © Digit-Life.com 1997-2004.
T Topfer, KP Petrov, Y Mine, D Jundt, RF Curl, and FK Tittel, Room-temperature mid-infrared laser sensor for trace gas detection, Applied Optics, Oct. 20, 1997, pp. 8042-8049, vol. 36 No. 30, Oct. 20, 1997/ Applied Optics.
Cavity Enhancing Sensors using QC Lasers, Jun. 7, 2005, pp. 1-6, http://www.infrared.phl.gov/enhanced.sensors.html, Webmaster: Pamela Kinsey, Reviewed: Nov. 23, 2004.
Transient FM Absorption Spectroscopy, Jun. 7, 2005, pp. 1 and 2, http://www.chem.tamu.edu/group/north/FM.html.
FM Spectoscopy With Tunable Diode Lasers, Application Note 7, pp. 1-10, New Focus Copyright 2001.
John Andrews and Paul Dalin,Frequency Modulation Spectroscopy, Dec. 2005, pp. 24-26, http://www.spectroscopyeurope.com.
R.F. Curl and F.K. Tittel,Tunable infrared laser spectroscopy, 1998, pp. 219-272, Annu. Rep. Prog-Chem. Sect. C, 2002.
Shawn Wehe et al., AIAA 2002-0824 Measurements of Trace Pollutants in Combustion Flows Using Room-Temperature, Mid-IR Quantum Cascade Lasers , S. Wehe, et al. (Physical Science, Inc) C Gmachi and F Capasso (Bell Lab., Lucent Technologies), Jan. 2002, cover and pp. 1-7, 40th AIAA Aerospace Sciences Meeting and Exhibit 14, Jan. 17, 2002, Reno, NV.
W. Huang, RRA SYMS, J. Stagg and A.A. Lohmann, Precision MEMS Flexure mount for a Littman Tunable external cavity laser, Mar. 2004, pp. 67-75, IEE Prc-Sci Meas. Technol vol. 151, No. 2 Mar. 2004.
K. Namjou, S. Cai, E.A. Whitaker, J. Faist, C. Gmacahi, F. Capasso, D.L. Sivco and A.Y. Cho,Sensitive absorption spectroscopy with a room-temperature distributed-feedback quantum-cascade laser, 1998, pp. 219-221, 1998 Optical Society of America.
Gregory E. Hall and Simon W. North,Transient Laser Frequency Modulation Spectroscopy, 2000, pp. 243-274, Annu. Rev.Phys. Chem. 2000.51:243-74-Copyright 2000.
External-cavity quantum-cascade lasers, May 11, 2005, pp. 1-4, http://www.unine.ch/phys/meso/EC/EC.html.
Frequency stabilization of diode lasers, May 30, 2005, pp. 1-17, Santa Chawla—National Physical Laboratory, http://www.ias.ac.in/currsci/jan25/articles41.htm, National Physical Lab, New Delhi 110 012 India.
R.A. Syms, A. Lohmann, MOEMS Tuning Element for a Littrow External Cavity Laser, Dec. 2003, pp. 921-928, Journal of Microelectromechanical Systems, vol. 12, No. 6 Dec. 2003.
A.A. Koserev et al., Thermoelectrically cooled quantum cascade laser based sensor for continuous monitoring of ambient atmospheric CO—AA Koserev, FK Tittel, R Kohler, C Gmachi, F Capasso, DL Sivco, AY Cho, S Wehe and M Allen, 2002, cover and pp. 1-16, Copyright 2002 Optical Society of America (provided in parent U.S. Appl. No. 11/154,264).
Cooke, M., Producing more light than heat from quantum cascade lasers, published on-line Jan. 10, 2010, www.semiconductor-today.com, Semiconductor Today, vol. 5, Issue 1, pp. 106-107, Feb. 2010.
Lincoln Laboratory, News, MIT Lincoln Laboratory creates bright diode lasers, posted on-line Oct. 2009, pp. 1-2, MIT Lincoln Laboratory:News: MIT Lincoln Laboratory creates bright diode lasers, © 2011 Lincoln Laboratory, Massachusetts Institute of Technology.
Lincoln Laboratory, Publications, Lab Notes, Laser Technology, A Bright Idea, Simple tweaks turn into tiny diode lasers into powerhouses, posted on-line Jun. 2010, pp. 1-3, MIT Lincoln Laboratory:Lab Note: A Bright Idea, © 2011 Lincoln Laboratory, Massachusetts Institute of Technology.
Michael Hacskaylo, "Laser Aiming Light," Army Electronics Command Fort Belvoir, VA Night Vision Lab, Jan. 1974, 26 pages, US Department of Commerce, Technology Administration, National Technical Information Service, Springfield, VA 22161.
Lawrence T. Marshall et al., "Integrated Sight,"CECOM RDEC Night Vision and Electronic Sensors Directorate, Fort Belvoir, VA, Texas Instruments, Inc., Plano, TX, Jun. 1997, 8 pages, SPIE vol. 3080, 0277-786X/97, SPIE Digital Library.
T.L. Myers et al., "FY 2005 Quantum Cascade Laser Alignment System Final Report," Dec. 2005, 52 pages, PNNL-15600, Pacific Northwest National Laboratory, prepared for the U.S. Department of Energy.
Joe S. Randella et al., "The Integrated Sight: Future Improvement for Land Warrior,"Aug. 1998, pp. 62-72, Proceedings of the SPIE—SPIE vol. 3394, The International Society for Optical Engineering, SPIE Digital Library.
Jacob B. Khurgin et al., "Transport and gain in a quantum cascade laser model and equivalent circuit," Nov. 2010, 9 pages, Optical Engineering 49(11), 111110, SPIE Nov. 2010/vol. 49 (11), © 2010 SPIE, SPIE Digital Library.

(56) References Cited

OTHER PUBLICATIONS

Shunt Switched Current Control. Applicant admits that this circuit design is prior art and used more than one year prior to Aug. 16, 2010.
QC Current Regulator. Applicant admits that this circuit design is prior art and used more than one year prior to Aug. 16, 2010.
Thorlabs, Thorlabs.com-Tunable Lasers:Littrow and Littman Prealigned Kits, OFC Information Sheet 2011, http://www.thorlabs.us/newgrouppage9.cfm?objectgroup_id=4757, © 1999-2011 Thorlabs.

Oleksiy Andrusyak et al., External and common-cavity high spectral density beam combining of high power fiber lasers, Jan. 1, 2008, Proc. of SPIE vol. 6873, SPIE Digital Library.

Thomas Schreiber et al., Incoherent Beam Combining of Continuous-Wave and Pulsed Yb-Doped Fiber Amplifiers, Mar. 1, 2009, vol. 15, No. 2, © 2009 IEEE.

US 7,733,928, 06/2010, Marsland, Jr. et al. (withdrawn)

* cited by examiner

THERMAL POINTER

RELATED INVENTIONS

This application is a continuation in part of U.S. application Ser. No. 12/427,364, filed on Apr. 21, 2009 now U.S. Pat. No. 8,306,077, and entitled "HIGH OUTPUT, MID INFRARED LASER SOURCE ASSEMBLY". Additionally, this application claims priority on U.S. Provisional Application Ser. No. 61/416,237, filed Nov. 22, 2010 and entitled "THERMAL POINTER". As far as is permitted, (i) the contents of U.S. application Ser. No. 12/427,364, filed on Apr. 21, 2009, and entitled "HIGH OUTPUT, MID INFRARED LASER SOURCE ASSEMBLY" are incorporated herein by reference, and (ii) the contents of U.S. Provisional Application Ser. No. 61/416,237 are incorporated herein by reference.

GOVERNMENT SPONSORED DEVELOPMENT

The U.S. Government has rights in this invention pursuant to contract number N00164-11-C-JQ23 with the United States Department of Defense.

BACKGROUND

Laser sources that produce an output beam can be used in many fields such as, thermal pointing, medical diagnostics, pollution monitoring, leak detection, analytical instruments, homeland security and industrial process control. Unfortunately, many portable, compact laser sources do not generate an output beam having sufficient power and/or the desired spectral characteristics.

SUMMARY

The present invention is directed toward a laser source assembly for providing an assembly output beam, the laser source assembly including an assembly axis. In certain embodiments, the laser assembly comprises a first emitter, a second emitter, and a third emitter. The first emitter emits a first beam along a first beam axis that is substantially parallel to and spaced apart from the assembly axis. The second emitter emits a second beam along a second beam axis that is substantially parallel to and spaced apart from the assembly axis. The third emitter emits a third beam along a third beam axis that is substantially parallel to and spaced apart from the assembly axis. Additionally, the first beam axis, the second beam axis and the third beam axis are positioned spaced apart about and substantially equidistant from the assembly axis.

In one embodiment, the first beam axis, the second beam axis and the third beam axis are positioned substantially evenly spaced apart about the assembly axis.

Additionally, in one embodiment, the laser source assembly can further comprise a fourth emitter that emits a fourth beam along a fourth beam axis that is substantially parallel to and spaced apart from the assembly axis. In such embodiment, the first beam axis, the second beam axis, the third beam axis and the fourth beam axis are positioned spaced apart about and substantially equidistant from the assembly axis.

In certain embodiments, the laser source assembly can further comprise a beam adjuster assembly that collectively expands the beams and subsequently collimates the beams. Additionally, the laser source assembly can include a first lens that collimates the first beam, a second lens that collimates the second beam, and a third lens that collimates the third beam. The laser source assembly can also include one or more lens mounting assemblies to support the first lens, the second lens and/or the third lens so that the lenses are positioned coaxial with the corresponding beam axis. In one embodiment, the lens mounting assembly can include a mount frame and a height compensator. The mount frame can be generally rectangular shaped and the height compensator can be somewhat wedge shaped to allow for the position of the lens to be adjusted as necessary.

In one embodiment, the beam adjuster assembly includes (i) a diverging lens that diverges the first beam that exits the first lens, the second beam that exits the second lens, and the third beam the exits the third lens, and (ii) an assembly lens that collimates the first beam, the second beam, and the third beam exiting from the diverging lens.

Further, in some embodiments, the first beam can include a first set of wavelengths, the second beam can include a second set of wavelengths, and the third beam can include a third set of wavelengths. In one such embodiment, the first wavelength set is different from the second set of wavelengths and the third set of wavelengths. Alternatively, in one embodiment, the first set of wavelengths is equal to the second set of wavelengths and the third set of wavelengths.

Additionally, in one embodiment, the laser source assembly further comprises a system controller that directs power to the first emitter, the second emitter and the third emitter to adjust a pulse width and a repetition rate of the assembly output beam.

The present invention is further directed toward a targeting assembly comprising a thermal imager that captures a thermal image, and a laser source assembly having features as described above. Additionally, the present invention is also directed toward a weapon assembly comprising a weapon and the targeting assembly as described above.

Still further, the present invention is directed toward a thermal pointer assembly for use with a thermal imager to highlight a target for a weapon. In some embodiments, the thermal pointer assembly comprises a thermal pointer and a thermal insulator mount. The thermal pointer includes (i) a first emitter that emits a first beam along a first beam axis; (ii) a heat dissipater that dissipates heat; and (ii) a mounting base that retains the first emitter and transfers the heat generated by the first emitter to the heat dissipater. The thermal insulator mount secures the thermal pointer to the weapon. Additionally, the thermal insulator mount inhibits the transfer of heat between the weapon and the thermal pointer.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which.

Some of Figures include an orientation system that illustrates an X axis, a Y axis that is orthogonal to the X axis, and a Z axis that is orthogonal to the X and Y axes. It should be noted that these axes can also be referred to as the first, second and third axes.

DESCRIPTION

Figure 1A:
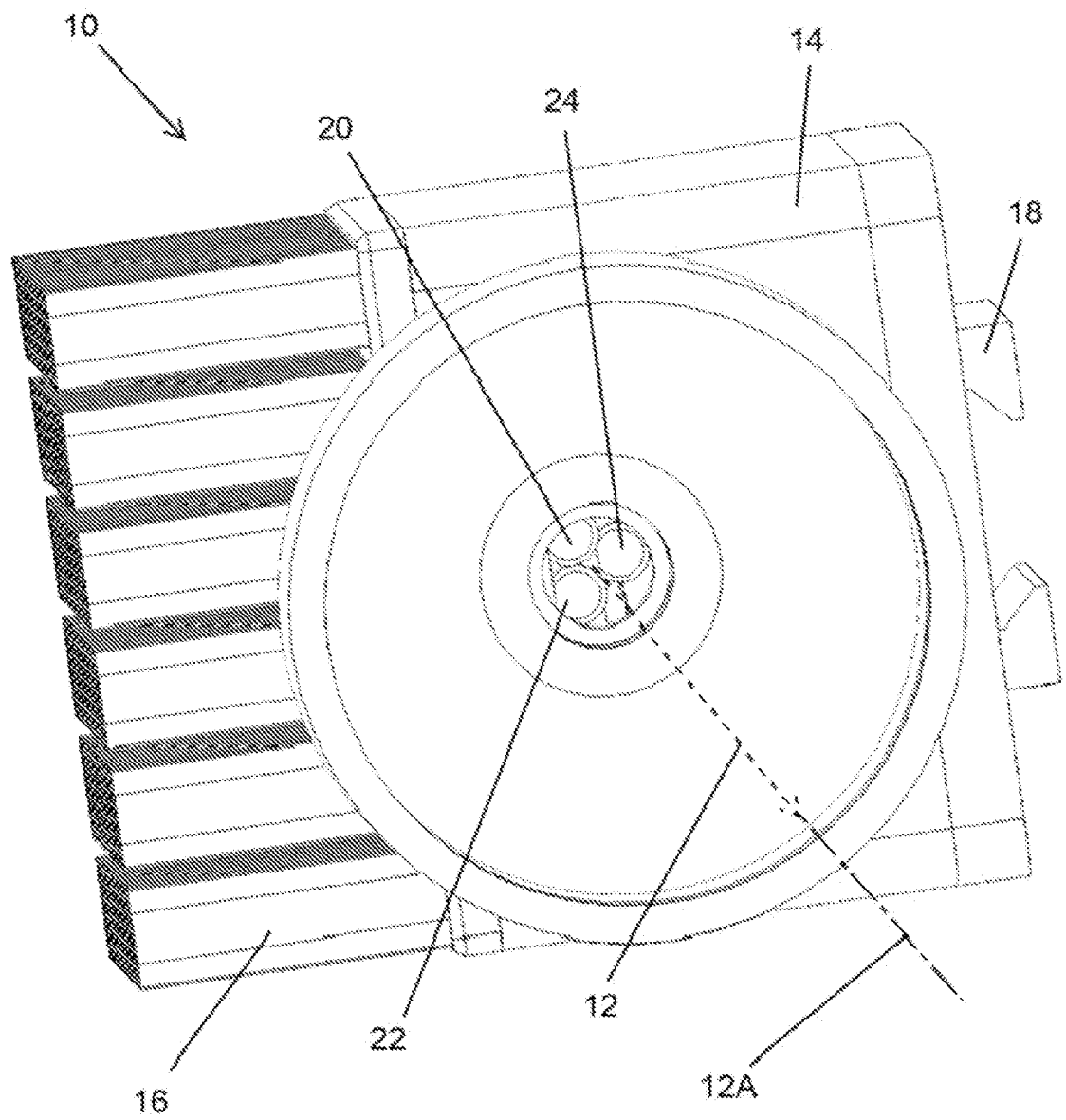
FIG. 1A is a perspective view of one embodiment of a laser source assembly having features of the present invention.

FIG. 1A is a perspective view of one embodiment of a laser source assembly 10, having features of the present invention. As illustrated, the laser source assembly 10 generates and/or emits an assembly output beam 12 (illustrated with a dashed arrow line) that is directed along an assembly axis 12A.

Figure 8:
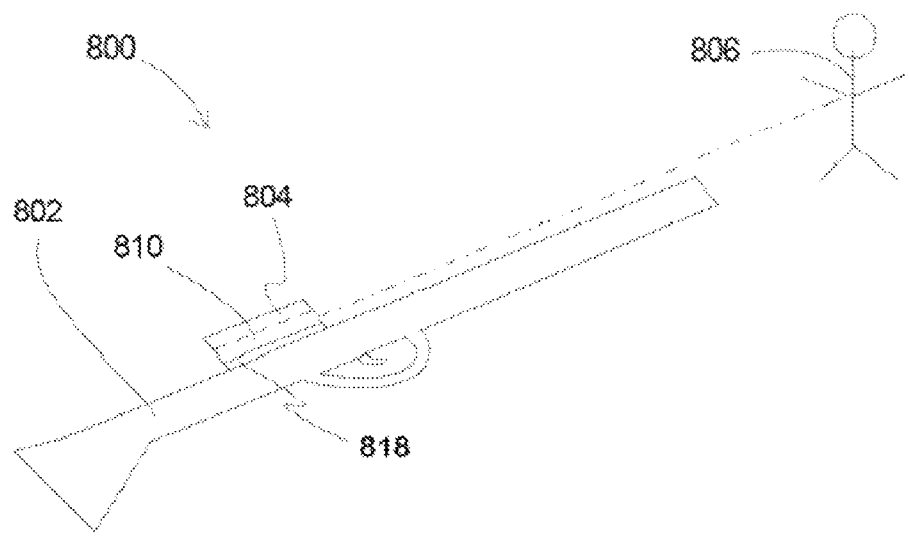
FIG. 8 is a simplified side view of an embodiment of a weapon assembly having features of the present invention.

There are a number of possible usages for the laser source assembly 10 disclosed herein. For example, as illustrated in FIG. 8, the laser source assembly 10 can be used as a thermal pointer 810 on a weapon 802 (illustrated in FIG. 8), e.g., a gun, in conjunction with a thermal imager 804 (illustrated in FIG. 8) to locate, designate, and/or aim at one or more targets 806 (illustrated in FIG. 8). In this embodiment, the laser source assembly 10 is uniquely designed so that the assembly output beam 12 travels a long distance through the atmosphere to illuminate a portion of the target.

Alternatively, for example, in certain embodiments, the laser source assembly 10 can be used for a free space communication system in which the laser source assembly 10 is operated in conjunction with an IR detector located far away, to establish a wireless, directed, invisible data link. Still alternatively, the laser source assembly 10 can be used for any application requiring transmittance of directed infrared radiation through the atmosphere at large distances, to simulate a thermal source to test IR imaging equipment, as an active illuminator to assist imaging equipment, or any other application.

The design, size and shape of the laser source assembly 10 can be varied pursuant to the teachings provided herein. In the embodiment illustrated in FIG. 1A, the laser source assembly 10 includes a housing 14, a heat dissipater 16, a pointer mount 18, and a plurality of laser sources, e.g., a first laser source 20, a second laser source 22, and a third laser source 24. Still alternatively, the laser source assembly 10 can include greater than three or less than three laser sources 20, 22, 24.

As an overview, in certain embodiments, the plurality of laser sources 20, 22, 24 are packaged in a portable, compact, common module, with each of the laser sources 20, 22, 24 generating a beam, e.g., a first beam 26 (illustrated in FIG. 1D) by the first laser source 20, a second beam 28 (illustrated in FIG. 1D) by the second laser source 22, and a third beam 30 (illustrated in FIG. 1D) by the third laser source 24. Additionally, in certain embodiments, the beams 26, 28, 30 are combined to create the assembly output beam 12. With this design, the number and characteristics of the laser sources 20, 22, 24 can be changed to achieve the desired power and spectral characteristics of the assembly output beam 12 in order to suit the particular application for the laser source assembly 10. As a result thereof, in certain embodiments, the laser source assembly 10 can generate a multiple watt assembly output beam 12 that has the desired spectral profile to propagate with sufficient power through the atmosphere.

As used herein, the term "combines" shall mean (i) that the beams are directed parallel to one another (e.g., the beams travel along parallel axes), and (ii) that the beams are fully overlapping, partly overlapping, or are directly adjacent to one another.

The housing 14 encircles and/or encloses many of the elements of the laser source assembly 10. For example, as illustrated, each of the first laser source 20, the second laser source 22, and the third laser source 24 are positioned near one another within the housing 14. The design of the housing 14 can be varied. In the embodiment illustrated in FIG. 1A, the housing 14 is substantially rectangular or square box shaped. Alternatively, the housing 14 can have a different shape.

The heat dissipater 16 transfers heat from the laser source assembly 10. More particularly, the heat dissipater 16 transfers heat away from the laser sources 20, 22, 24 and/or other elements of the laser source assembly 10 and into the surrounding environment so that the laser sources 20, 22, 24 can function properly. In FIG. 1A, the heat dissipater 16 includes a fin assembly having a plurality of fins that passively cool the laser source assembly 10. Additionally and/or alternatively, the heat dissipater 16 can include an active cooling system, such as a Thermo Electric Cooler (TEC).

The pointer mount 18 can be used to selectively or permanently secure the laser source assembly 10 to the weapon 802. In one embodiment, the pointer mount 18 can include two attachment guides. With this design, the attachment guides can slide onto and engage a rail (not shown) on the weapon 802 to selectively secure the laser source assembly 10 to the weapon 802. Alternatively, the pointer mount 18 can secure the laser source assembly 10 to the weapon 802 in another fashion.

Figure 1B:
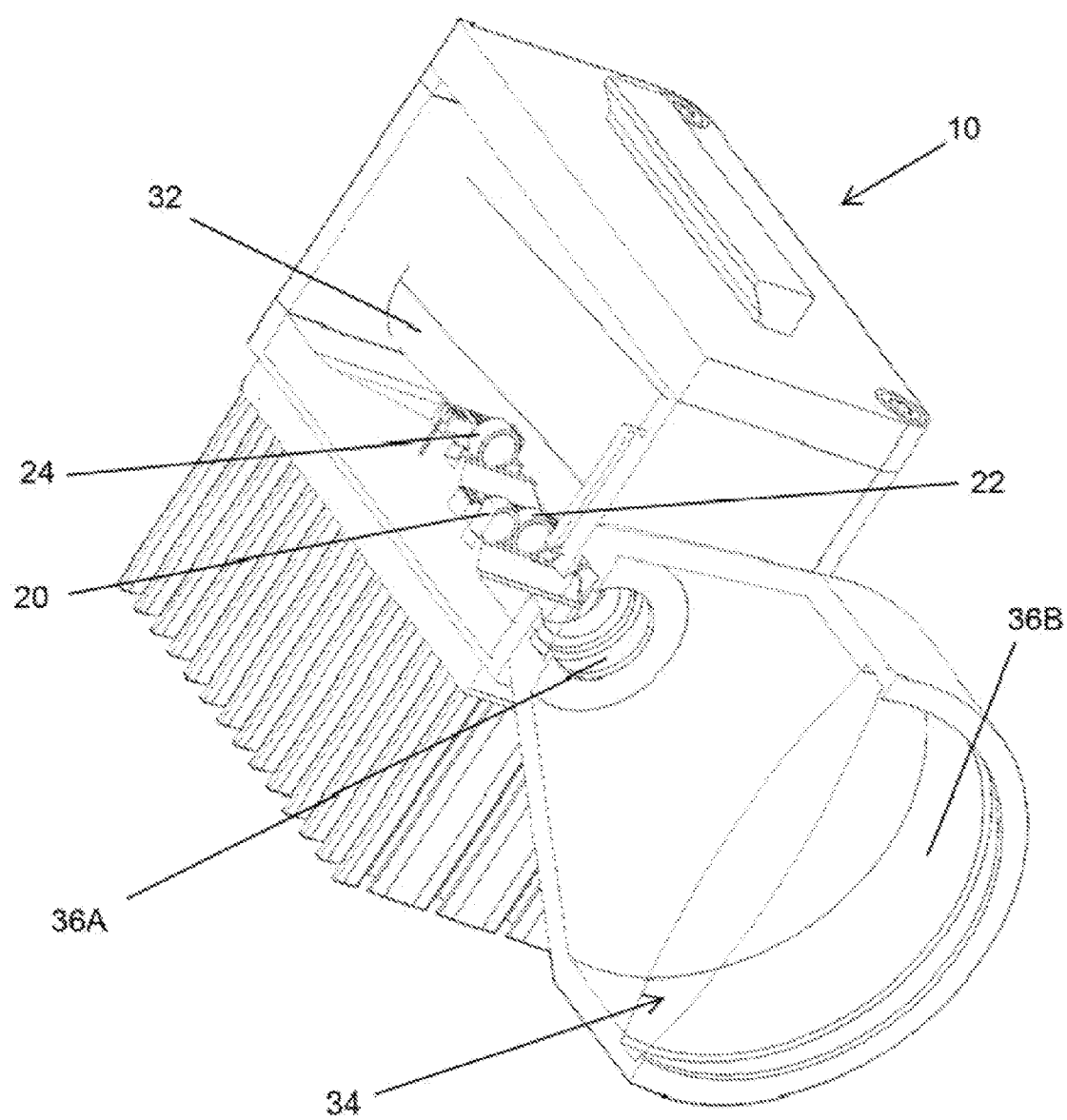
FIG. 1B is a perspective cut-away view of the laser source assembly of FIG. 1A.

FIG. 1B is a perspective cut-away view of the laser source assembly 10 of FIG. 1A. FIG. 1B illustrates that in addition to the three laser sources 20, 22, 24, the laser source assembly 10 includes one or more batteries 32 that power the three laser sources 20, 22, 24. Alternatively, the laser source assembly 10 can be powered by a generator, or another power source.

Additionally, FIG. 1B illustrates that the laser source assembly 10 can include a beam adjuster assembly 34. In this embodiment, the beam adjuster assembly 34 is used to expand the beams 26, 28, 30 (illustrated in FIG. 1D) from a smaller to a larger collimated beam diameter. Stated another way, the beam adjuster assembly 34 is uniquely designed to minimize beam divergence, as low divergence is a necessary characteristic in order to provide a smaller spot on the target at greater distances.

In one embodiment, the beam adjuster assembly 34 is a two lens system that functions somewhat similar to a beam expanding telescope. More specifically, in this embodiment, the beam adjuster assembly 34 includes a convex collimating diverging lens 36A, and a concave collimating assembly lens 36B. The diverging lens 36A expands and/or diverges each of the beam 26, 28, 30 generated by the laser sources 20, 22, 24. Subsequently, the assembly lens 36B re-collimates each of the beams 26, 28, 30. Stated in another manner, the assembly lens 36B collimates the beams 26, 28, that have exited from the diverging lens 36A. Together, the lenses of the beam adjuster assembly 34 are a beam expander, going from a smaller to a larger collimated beam diameter.

In FIG. 1B, the diverging lens 36A is closer to the laser sources 20, 22, 24 than the assembly lens 36B. In certain non-exclusive alternative embodiments, the beam adjuster assembly 34 can increase the diameter of a beam (e.g. each beam that exits the laser sources 20, 22, 24) by a factor of between approximately 2 and 6, and reduce divergence accordingly. With this design, by using a single beam adjuster assembly 34, i.e. a single telescope, nominal ocular hazard distance (NOHD) or eye hazard range is improved, beam divergence is minimized, and power output can be efficiently scaled by stacking collimated beam arrays.

Figure 1C:
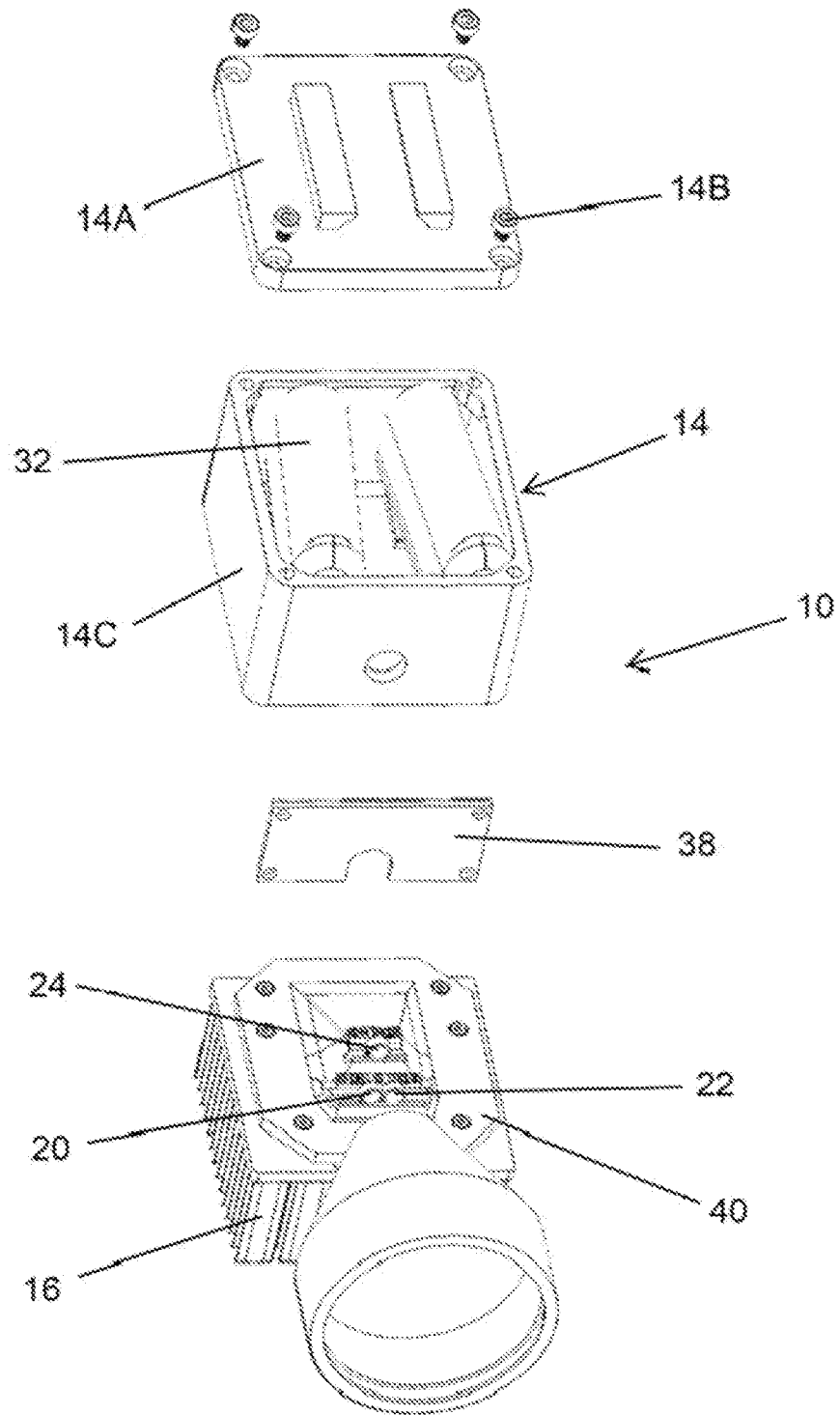
FIG. 1C is a partially exploded perspective view of the laser source assembly of FIG. 1A.

FIG. 1C is a partially exploded perspective view of the laser source assembly 10 of FIG. 1A. In particular, FIG. 1C illustrates the various features of the housing 14, and illustrates certain additional features and/or characteristics of the laser source assembly 10.

In the embodiment illustrated in FIG. 1C, the housing 14 includes a removable cover 14A that is selectively secured with a fastener assembly 14B (e.g., one or more bolts) to a chassis 14C of the housing 14. In one embodiment, the cover 14A is hermetically sealed to the chassis 14C in an air tight manner. This allows the housing 14 to provide a controlled environment around some of the components of the laser source assembly 10. For example, the housing 14 can be filled with a gas such as nitrogen or an air/nitrogen mixture to keep out moisture and humidity; or the housing 14 can be subjected to a vacuum.

Additionally, in this embodiment, multiple batteries 32 are positioned within the chassis 14C of the housing 14. As provided above, the batteries 32 provide power to the three laser sources 20, 22, 24 that are positioned within the housing 14.

FIG. 1C also illustrates that the laser source assembly 10 includes a printed circuit board 38 that is electrically connected to and directs power to the laser sources 20, 22, 24. The printed circuit board 38 can include one or more processors and circuits that control the electron injection current to the individual laser sources 20, 22, 24.

Further, as illustrated in FIG. 1C, the laser sources 20, 22, 24 are secured to or otherwise coupled to a mounting base 40 or bench, which is, in turn, secured to or otherwise coupled to the heat dissipater 16. In this embodiment, the mounting base 40 provides a rigid, one piece platform to support and retain the position of the laser sources 20, 22, 24. In certain embodiments, the mounting base 40 is designed to efficiently transfer the heat from the laser sources 20, 22, 24 to the heat dissipater 16. For example, the mounting base 40 can have a high thermal conductivity such as a thermal conductivity within the range of approximately 150-400 W/mK and more preferably in the range of approximately 220-250 W/mK. Non-exclusive examples of suitable materials for the mounting base 40 include magnesium, aluminum, carbon fiber composite, or high copper content copper-tungsten.

Figure 1D:
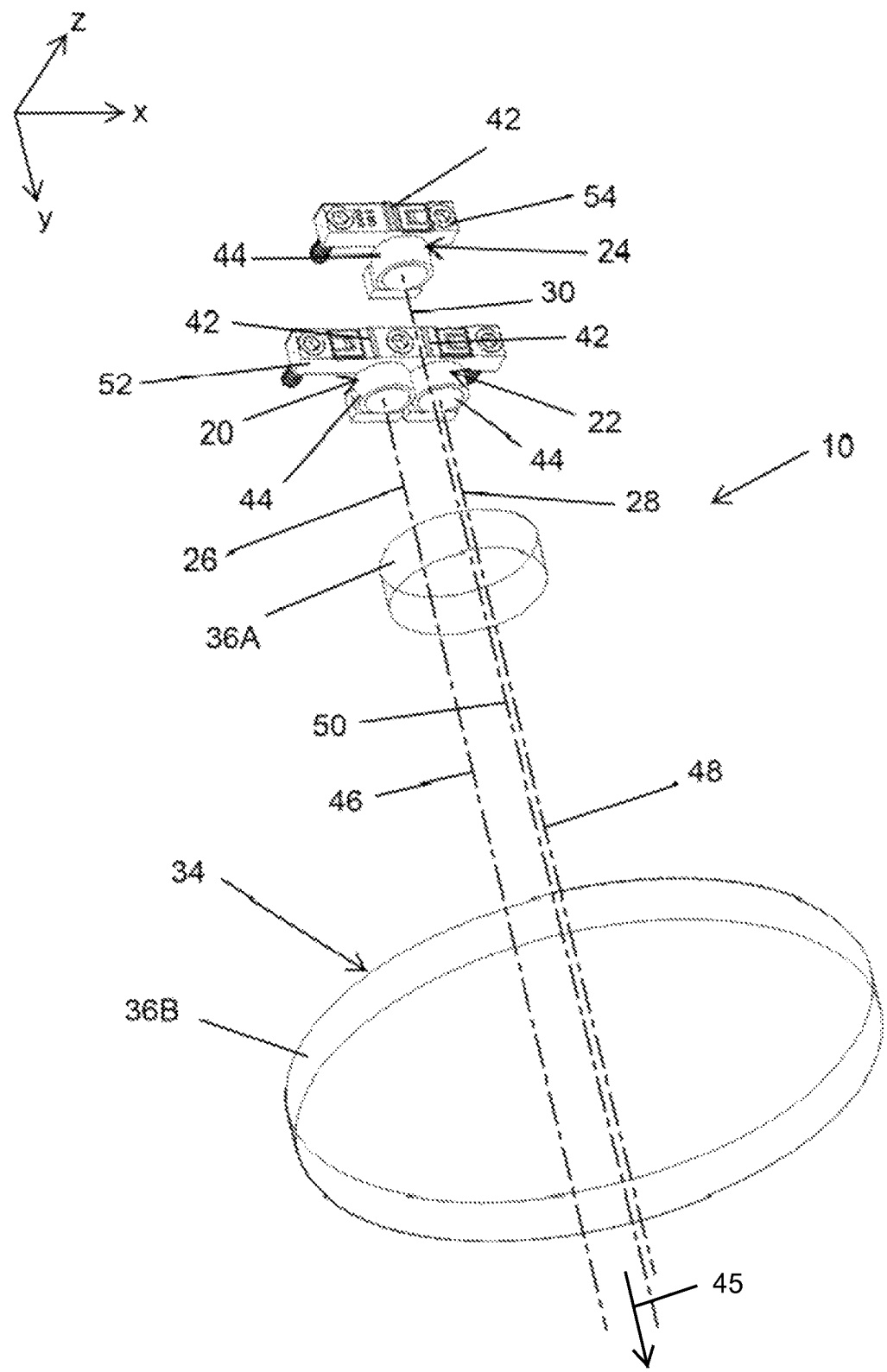
FIG. 1D is an enlarged perspective view of a portion of the laser source assembly of FIG. 1A.

FIG. 1D is an enlarged perspective view of a portion of the laser source assembly 10 of FIG. 1A. More specifically, FIG. 1D illustrates an enlarged view of the laser sources 20, 22, 24, and the lenses 36A, 36B of the beam adjuster assembly 34. In this embodiment, each of the laser sources 20, 22, 24 includes a gain medium 42 (also referred to as an "emitter"), and a collimating lens 44. It should be noted that the gain medium 42 of each of the laser sources 20, 22, 24 can be referred to as a first gain medium, a second gain medium, or a third gain medium. Further, the collimating lens 44 of each of the laser sources 20, 22, 24 can be referred to as a first lens, a second lens, or a third lens.

As provided herein, (i) the first laser source 20 generates and/or emits the first beam 26 that is directed in an output direction 45 along a first beam axis 46 (e.g., along the Y axis); (ii) the second laser source 22 generates and/or emits the second beam 28 that is directed in the output direction 45 along a second beam axis 48 (e.g., along the Y axis); and (iii) the third laser source 24 generates and/or emits the third beam 30 that is directed in the output direction 45 along a third beam axis 50 (e.g., along the Y axis). Further, the beams 26, 28, 30 are spaced apart from each other and are substantially parallel to each other. In one embodiment, exiting the laser sources 20, 22, 24, (i) the first beam 26 and the second beam 28 are spaced apart from each other along the X axis, and (ii) the third beam 30 is spaced apart from the first beam 26 and the second beam 28 along the X axis and along the Z axis. Moreover, the first beam axis 46, the second beam axis 48 and the third beam axis 50 are substantially parallel to and spaced apart from the assembly axis 12A (illustrated in FIG. 1A), and the first beam axis 46, the second beam axis 48 and the third beam axis 50 are positioned spaced apart from one another radially about the assembly axis 12A. Further, as illustrated in FIG. 1D, (i) the first beam 26 is non-folded and travels in only the output direction 45 along the first beam axis 46 between the first laser source 20 and the beam adjuster assembly 34, (ii) the second beam 28 is non-folded and travels in only the output direction 45 along the second beam axis 48 between the second laser source 22 and the beam adjuster assembly 34, and (iii) the third beam 30 is non-folded and travels in only the output direction 45 along the third beam axis 50 between the third laser source 24 and the beam adjuster assembly 34.

Further, in one embodiment, the first beam axis 46, the second beam axis 48 and the third beam axis 50 can be positioned spaced apart from one another radially about and substantially equidistant from the assembly axis 12A.

The design of the gain medium 42 and lens 44 for each laser source 20, 22, 24 can be varied to achieve the desired power and spectral characteristics of the assembly beam 12. In one embodiment, each gain medium 42 is a unipolar semiconductor laser such as a quantum cascade ("QC") gain medium that includes a series of energy steps built into the material matrix while the crystal is being grown. In one, non-exclusive embodiment, the QC gain medium 42 is mounted epitaxial growth side down, and has a length of approximately four millimeters, a width of approximately one millimeter, and a height of approximately one hundred microns. A suitable QC gain medium 42 can be purchased from Alpes Lasers, located in Switzerland.

Alternatively, for example, one or more of the gain media 42 can be an Interband Cascade Lasers (ICL), or another type of semiconductor laser.

For embodiments with a QC gain medium 42, each of the laser sources 20, 22, 24 is a mid-infrared ("MIR") laser source that generates a MIR beam 26, 28, 30. As used herein, to be classified as a MIR laser source, the MIR beam must have one or more wavelengths in the range of approximately 3-15 microns. Additionally, as used herein, the MIR range can include (i) a mid-wavelength infrared "MWIR" range of approximately 3-8 microns, and (ii) a long-wavelength infrared LWIR range of approximately 8-15 microns.

Additionally and/or alternatively, one or more of the beams 26, 28, 30 can be outside the MIR range. With this design, the beams 26, 28, 30 can be combined to create a multiple band assembly output beam 12.

In the embodiment illustrated in FIG. 1D, each gain medium 42 includes (i) a first facet that faces the collimating lens 44, and (ii) a second facet that faces away from the collimating lens 44. In FIG. 1D, the second facet is coated with a highly reflective coating so that the gain medium 42 emits only from the first facet and toward the collimating lens 44.

The collimating lenses 44 are designed to work with the wavelengths of the beams 26, 28, 30. For example, for MIR beams 26, 28, 30, these lenses 44 can be made from materials selected from the group of Ge, ZnSe, ZnS Si, CaF, BaF or Chalcogenide glass. However, other infrared materials may also be utilized.

For each laser source 20, 22, 24, the collimating lens 44 is positioned between the gain medium 42 and the diverging lens 36A of the beam adjuster assembly 34 along the lasing axis (e.g. along the Y axis in the Figures), and collimates and focuses the light. For example, each collimating lens 44 can be an aspherical lens having an optical axis that is aligned with the respective lasing axis. In one embodiment, to achieve the desired small size and portability, the collimating lens 44 has a relatively small diameter. In alternative, non-exclusive embodiments, the collimating lens 44 has a diameter of less than approximately 5 or 10 millimeters, and a focal length of approximately 1, 2, 3, 4, 5, 6, 7, 8, 9, 10, 11, 12, 13, 14, 15, 16, 17, 18, 19, or 20 mm and any fractional values thereof. The collimating lens 44 can be designed to have a relatively large numerical aperture (NA). For example, the collimating lens 44 can have a numerical aperture of at least approximately 0.6, 0.7, or 0.8. The NA may be approximated by the lens diameter divided by twice the focal length. Thus, for example, a lens diameter of 5 mm having a NA of 0.8 would have a focal length of approximately 3.1 mm.

In the embodiment illustrated in FIG. 1D, the gain medium 42 of the first laser source 20 and the gain medium 42 of the second laser source 22 are positioned on a common heat sink 52, and the gain medium 42 of the third laser source 24 is positioned on an individual heat sink 54. Further, these heat sinks 52, 54 are fixedly secured to the mounting base 40. In certain embodiments, each gain medium 42 generates a significant amount of heat. Accordingly, the heat sinks 52, 54 and the heat dissipater 16 (illustrated in FIG. 1A) are important to remove the heat, thereby permitting a long operational life for the laser source assembly 10.

In one embodiment, each heat sink 52, 54 provides a rigid, one-piece platform for fixedly mounting and maintaining the relative positions of the gain medium 42 of each laser source 20, 22, 24, and each heat sink 52, 54 is rigid and made of a material having relatively high thermal conductivity. In one non-exclusive embodiment, each heat sink 52, 54 has a thermal conductivity of at least approximately 170 Watts/meter K. With this design, in addition to rigidly supporting the components of the gain medium 42, the heat sinks 52, 54 also readily transfer heat away from the gain media 42 to the heat dissipater 16 via the mounting base 40. For example, each heat sink 52, 54 can be fabricated from a single, integral piece of copper, copper-tungsten or other material having a sufficiently high thermal conductivity. The one-piece structure maintains the fixed relationship of the components mounted thereto and contributes to the small size and portability of the laser source assembly 10.

In FIG. 1D, the common heat sink 52 holds the gain medium 42 of the first laser source 20 and the gain medium 42 of the second laser source 22 at the same position along the Z axis and along the Y axis, and spaced apart from one another along the X axis. Further, the individual heat sink 54 holds the gain medium 42 of the third laser source 24 at a different position along the Z axis, along the Y axis, and along the X axis than the gain medium 42 of the first laser source 20 and the gain medium 42 of the second laser source 22. With this design, the laser sources 20, 22, 24 can be positioned relative to one another such that the first beam 26, the second beam 28 and the third beam 30 are directed spaced apart and parallel to one another in a compact array, with the first beam axis 46, the second beam axis 48 and the third beam axis 50 being positioned spaced apart from one another radially about the assembly axis 12A.

The amount of space between the MIR beams 26, 28, 30 near the respective collimating lens 44 can be varied. In one embodiment, the laser source assembly 10 can be designed so that the individual beams 26, 28, 30 co-propagate parallel to and spaced apart a small distance from one another after exiting the respective collimating lens 44. With this design, the beams 26, 28, 30 propagate along parallel axes. In alternative, non-exclusive embodiments, the amount of space between the beams 26, 28, 30 near the collimating lens 44 is less than approximately 3, 4, 5, 6, 7, 8, 9, 10, 11, or 12 millimeters. In one non-exclusive embodiment, the amount of space between the beams 26, 28, 30 near the collimating lens 44 is less than a diameter of the collimating lens 44. With this design, the beam adjuster assembly 34 spatially combines the beams 26, 28, 30 of the multiple laser sources 20, 22, 24, while minimizing the overall size requirements of the laser source assembly 10.

In one embodiment, the diverging lens 36A and the assembly lens 36B of the beam adjuster assembly 34 each have an optical axis that is substantially aligned with and/or parallel to the Y axis. In one embodiment, to achieve the desired small size and portability of the laser source assembly 10, the diverging lens 36A and the assembly lens 36B of the beam adjuster assembly 34 each have a relatively small diameter. In the embodiment illustrated in FIG. 1D, the diameter of the diverging lens 36A is smaller than the diameter of the assembly lens 36B. In alternative, non-exclusive embodiments, the diverging lens 36A of the beam adjuster assembly 34 has a diameter of between approximately 0.25 and 1 inch, and any fractional values thereof. Further, in alternative, non-exclusive embodiments, the assembly lens 36B of the beam adjuster assembly 34 has a diameter of between approximately 1 and 4 inches, and any fractional values thereof. Still alternatively, the diverging lens 36A and the assembly lens 36B can have diameters that are either greater or smaller in diameter than those values specifically listed above.

The lenses 36A, 36B of the beam adjuster assembly 34 are designed to work with the wavelengths of the beams 26, 28, 30. For example, for MIR beams 26, 28, 30, these lenses 36A, 36B can be made from materials selected from the group of Ge, ZnSe, ZnS Si, CaF, BaF or Chalcogenide glass. However, other materials may also be utilized that are effective with the wavelengths of the MIR beams and the non-MIR beam. Additionally, the lenses 36A and 36B of the beam adjuster assembly 34 may be spherical or aspherical focal or afocal.

As provided herein, the printed circuit board 38 (illustrated in FIG. 1C) can include a system controller that directs power in a pulsed fashion to one or more of the laser sources 20, 22, 24. As a result thereof, the intensity of the assembly output beam 12 is also pulsed. In this operation mode, the laser source 20, 22, 24 is a pulsed wave laser that provides a pulsed beam. In one embodiment, the duty cycle is approximately fifty percent, e.g., the power is directed to the laser for a predetermined period of time and alternately the power is not directed to the laser for the same predetermined period of time. Alternatively, the duty cycle can be greater than or less than fifty percent.

In one, non-exclusive embodiment, the system controller pulses approximately 5-20 Watts peak power (as opposed to constant power) to each gain medium 42 in a low duty cycle wave form. With this design, the gain medium 42 lases with little to no heating of the core of the gain medium 42, the average power directed to the gain medium 42 is relatively low, and the desired average optical power of the assembly output beam 12 can be efficiently achieved. It should be noted that as the temperature of the gain medium 42 increases, the efficiency of the gain medium 42 decreases. With this embodiment, the pulsing of the gain medium 42 keeps the gain medium 42 operating efficiently and the overall system utilizes relatively low power.

It should be noted that in the pulsed mode of operation, the system controller can simultaneous direct pulses of power to each of the laser sources 20, 22, 24 so that each of the laser sources 20, 22, 24 generates and/or emits the respective beam 26, 28, 30 at the same time. Alternatively, the system controller can direct pulses of power to one or more of the laser sources 20, 22, 24 at different times so that the laser sources 20, 22, 24 generate and/or emit the respective beam 26, 28, 30 at different times.

Figure 1E:
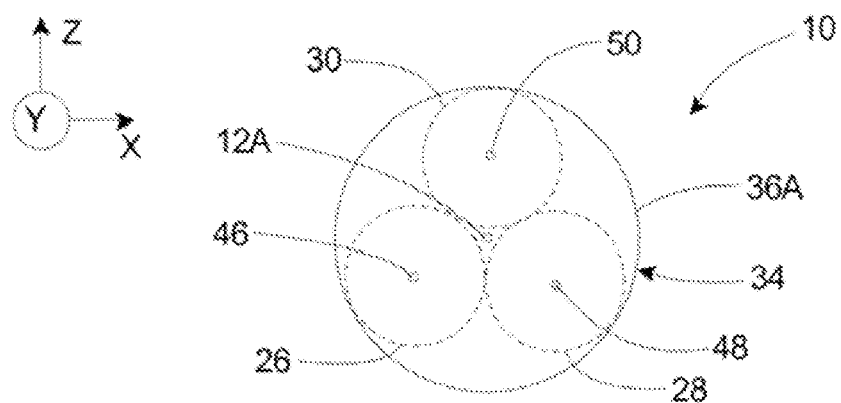
FIG. 1E is a simplified illustration of three beams on a lens.

FIG. 1E is a simplified illustration of the first beam 26, the second beam 28, and the third beam 30 impinging on the diverging lens 36A of the beam adjuster assembly 34. Additionally, FIG. 1E illustrates the assembly axis 12A (illustrated as a small circle) positioned substantially at the center of the diverging lens 36A, the first beam axis 46 (illustrated as a small circle) positioned substantially at the center of the first beam 26, the second beam axis 48 (illustrated as a small circle) positioned substantially at the center of the second beam 28 and the third beam axis 50 (illustrated as a small circle) positioned substantially at the center of the third beam 30. It should be noted that each of the assembly axis 12A, the first beam axis 46, the second beam axis 48 and the third beam axis 50 are directed in and out of the page (i.e. parallel to the Y axis) in FIG. 1E.

As illustrated in this embodiment, the first beam axis 46, the second beam axis 48 and the third beam axis 50 are positioned spaced apart about and substantially equidistant from the assembly axis 12A. Additionally, in one embodiment, the first beam axis 46, the second beam axis 48 and the third beam axis 50 are positioned substantially evenly spaced apart from one another radially about the assembly axis 12A. In this embodiment, the laser sources 20, 22, 24 (illustrated in FIG. 1D) are positioned so that the first beam axis 46, the second beam axis 48 and the third beam axis 50 are positioned approximately one hundred twenty degrees from one another radially about the assembly axis 12A.

Alternatively, in an embodiment having four laser sources, the beam axes can be positioned approximately ninety degrees from one another radially around the assembly axis 12A. Still alternatively, the laser source assembly 10 can have a different number of laser sources that are substantially evenly spaced apart from one another about the assembly axis 12A, and/or the laser sources can have a different orientation relative to one another about the assembly axis 12A.

Moreover, in certain embodiments, the beams 26, 28, 30 are positioned very close together in a compact array. For example, as illustrated in FIG. 1E, the first beam 26, the second beam 28 and the third beam 30 can be substantially directly adjacent to one another. With this design, the overall footprint of the laser source assembly 10 can be made smaller. Alternatively, the beams 26, 28, 30 can be spaced apart a small gap and/or the beams 26, 28, 30 can slightly overlap.

In certain embodiments, an important aspect of the assembly output beam 12 is the ability to propagate through the atmosphere with sufficient power to highlight the target. Typically, the atmosphere absorption is mainly due to water and carbon dioxide. In one embodiment, the laser source assembly 10 is designed to generate a relatively high power assembly output beam 12 having a diverse spectral profile in the MIR range. With this design, even if certain wavelengths of the assembly output beam 12 are absorbed by the atmosphere, other wavelengths of the assembly output beam 12 will propagate through the atmosphere.

Figure 1F:
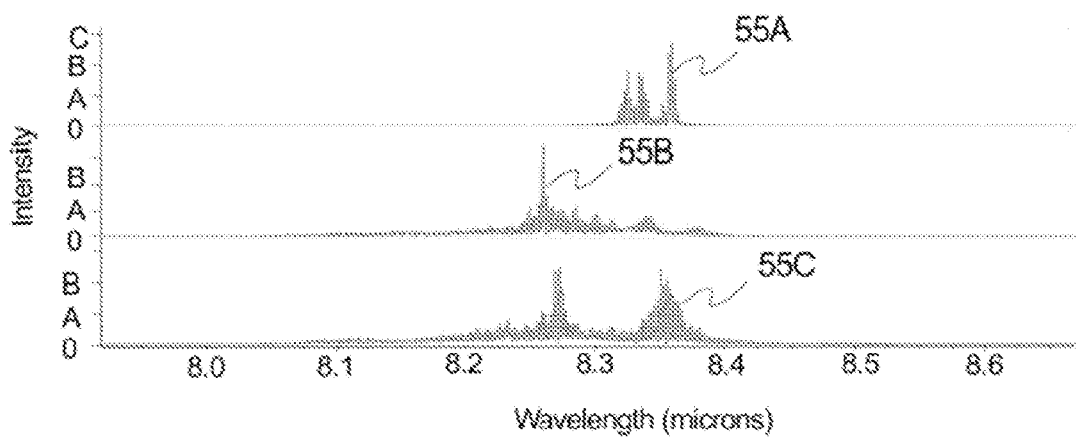
FIG. 1F is a graph that illustrates a non-exclusive example of three wavelength sets.

For example, FIG. 1F is a graph that illustrates a non-exclusive example of (i) a first wavelength set 55A of the first beam 26 generated by the first laser source 20 (illustrated in FIG. 1D); (ii) a second wavelength set 55B of the second beam 28 generated by the second laser source 22 (illustrated in FIG. 1D); and (iii) a third wavelength set 55C of the third beam 30 generated by the third laser source 24 (illustrated in FIG. 1D). In this embodiment, each wavelength set 55A, 55B, 55C is different. Stated in another fashion, in this embodiment, the plurality of wavelengths and the intensities of the wavelengths of each wavelength set 55A, 55B, 55C is different. With this design, when the beams 26, 28, 30 are combined, the resulting assembly output beam 12 has a relatively diverse spectral profile in the range of between approximately 8.2 to 8.4 microns.

It should be noted that the wavelength sets 55A-55C can be generated by three QC gain media that are manufactured and operated in a similar fashion. The differences in the wavelength sets 55A-55C are the result of no two QC gain media having the exact same characteristics. Further, in this embodiment, the QC gain media do not have a wavelength selective element. This simplifies the manufacturing and operation of the laser source assembly 10.

Figure 1G:
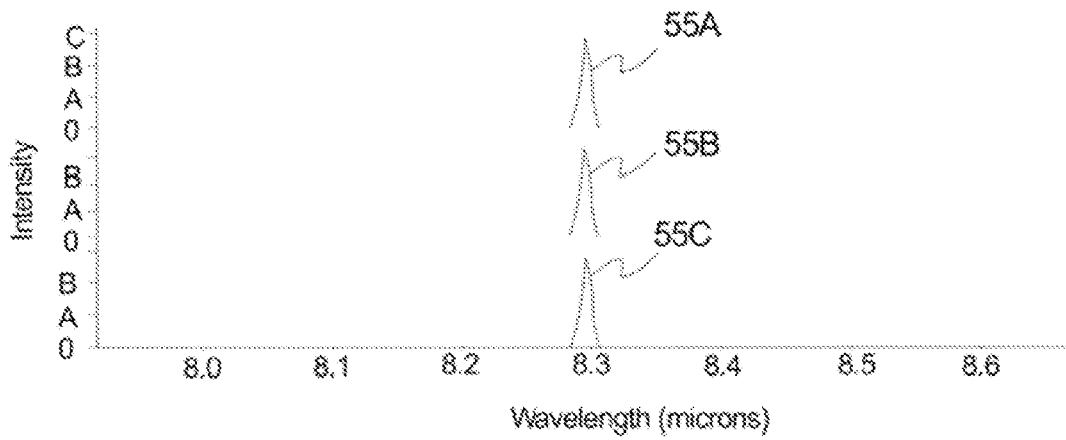
FIG. 1G is a graph that illustrates another non-exclusive example of three wavelength sets.

Alternatively, the laser source assembly 10 can be designed to be tuned so that the assembly output beam 12 has only wavelengths that propagate through the atmosphere with minimum absorption. For example, FIG. 1G is a graph that illustrates another non-exclusive example of (i) a first wavelength set 55A of the first beam 26 generated by the first laser source 20 (illustrated in FIG. 1D); (ii) a second wavelength set 55B of the second beam 28 generated by the second laser source 22 (illustrated in FIG. 1D); and (iii) a third wavelength set 55C of the third beam 30 generated by the third laser source 24 (illustrated in FIG. 1D). In this embodiment, each wavelength set 55A, 55B, 55C is approximately the same. Stated in another fashion, in this embodiment, the plurality of wavelengths and the intensities of the wavelengths of each wavelength set 55A, 55B, 55C are approximately the same. With this design, when the beams 26, 28, 30 are combined, the resulting assembly output beam 12 has a relatively narrow spectral profile that is selected to propagates through the atmosphere with minimum absorption.

Atmospheric propagation requires narrow linewidth and accurate settable wavelength to avoid absorption. In certain embodiments, the laser sources 20, 22, 24 each generate and/or emit a narrow linewidth MIR beam 26, 28, 30, and each of the laser sources 20, 22, 24 can be individually tuned so that each MIR beam 26, 28, 30 is at a wavelength that allows for maximum transmission (and minimal absorption) through the atmosphere. Stated in another fashion, the wavelength of each beam 26, 28, 30 is specifically selected to avoid the wavelengths that are readily absorbed by water, carbon dioxide or other atmospheric constituents that may be present, and the wavelengths of the beams 26, 28, 30 are in the atmospheric transmission windows.

As provided herein, in certain embodiments, one or more of the laser sources 20, 22, 24 can include a wavelength selective element that allows the wavelength of the respective beam 26, 28, 30 to be individually tuned. With this design, each of the laser sources 20, 22, 24 can be individually tuned so that a specific wavelength of the beams 26, 28, 30 of one or more of the laser sources 20, 22, 24 is the same or different.

The design of the wavelength selective element can vary. Non-exclusive examples of suitable wavelength selective elements include a diffraction grating, a MEMS grating, prism pairs, a thin film filter stack with a reflector, an acoustic optic modulator, or an electro-optic modulator. Further, a wavelength selective element can be incorporated in the gain medium 42.

In non-exclusive examples, the laser sources 20, 22, 24 can be designed so that the linewidth of each beam 26, 28, 30 is less than approximately 5, 4, 3, 2, 1, 0.8, 0.5, or 0.1 cm$^{-1}$. Alternatively, the laser sources 20, 22, 24 can be designed so that the line width of each beam 26, 28, 30 is greater than approximately 7, 8, 9, or 10 cm$^{-1}$.

Figure 2A:
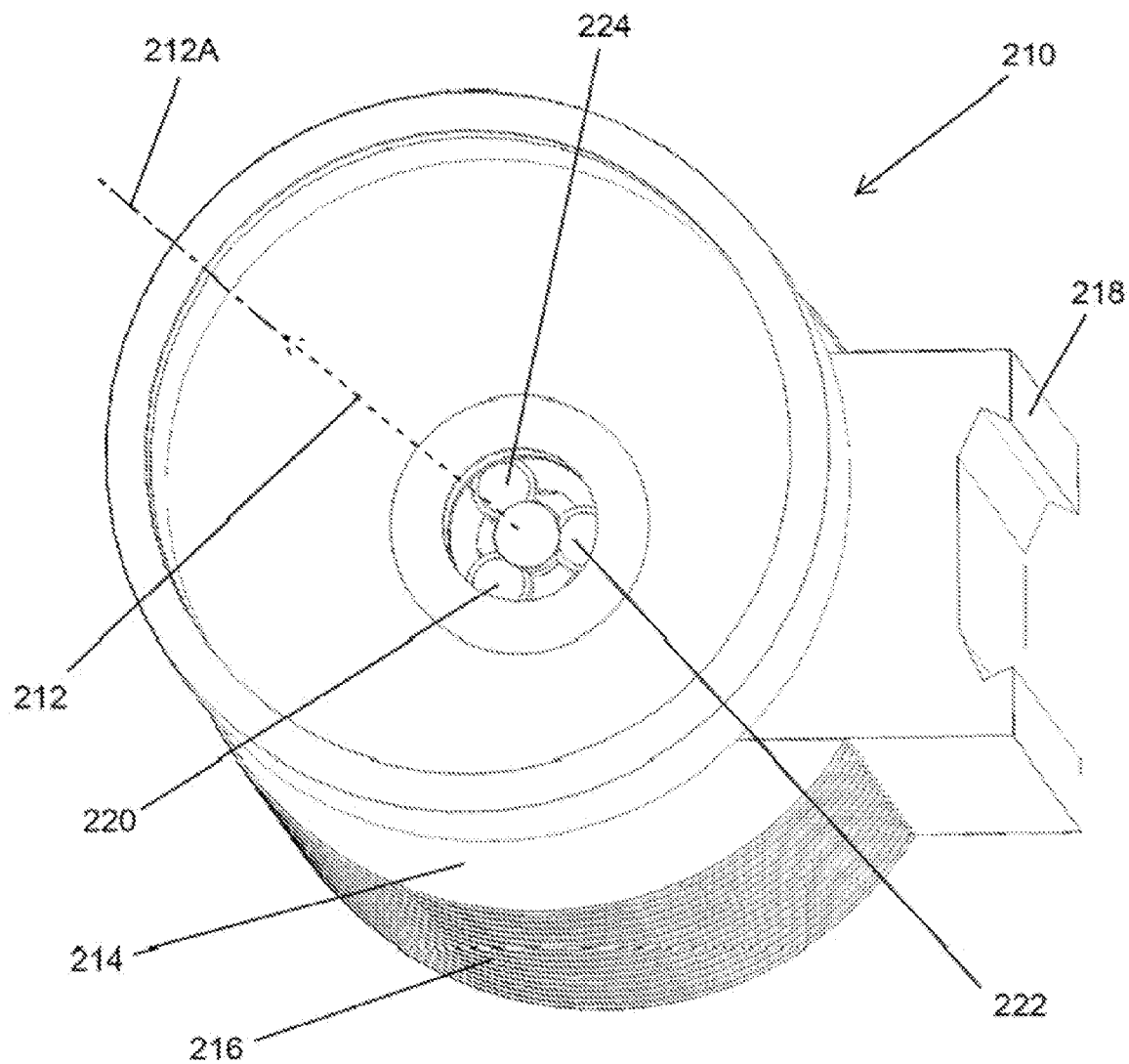
FIG. 2A is a perspective view of another embodiment of a laser source assembly having features of the present invention.

FIG. 2A is a perspective view of another embodiment of a laser source assembly 210 having features of the present invention that generates and/or emits an assembly output beam 212 (illustrated with a dashed arrow line) that is directed along an assembly axis 212A. The laser source assembly 210 illustrated in FIG. 2A is somewhat similar to the laser source assembly 10 illustrated and described above in relation to FIGS. 1A-1E. For example, in this embodiment, the laser source assembly 210 again includes a housing 214, a heat dissipater 216, a pointer mount 218, and a plurality of laser sources, e.g., a first laser source 220, a second laser source 222 and a third laser source 224 that are similar to the corresponding components described above.

In the embodiment illustrated in FIG. 2A, the housing 214 again encircles and/or encloses many of the elements of the laser source assembly 210. For example, as illustrated, each of the first laser source 220, the second laser source 222, and the third laser source 224 are positioned near one another within the housing 214. In the embodiment illustrated in FIG. 2A, the housing 214 is substantially cylinder shaped. Alternatively, the housing 214 can have a different shape.

Further, in FIG. 2A, the heat dissipater 216 is an annular shaped fin assembly that substantially surrounds the housing 214 of the laser source assembly 210. Alternatively, the fin assembly 216 can have a different shape and/or can have a different orientation relative to the housing 214.

Figure 2B:
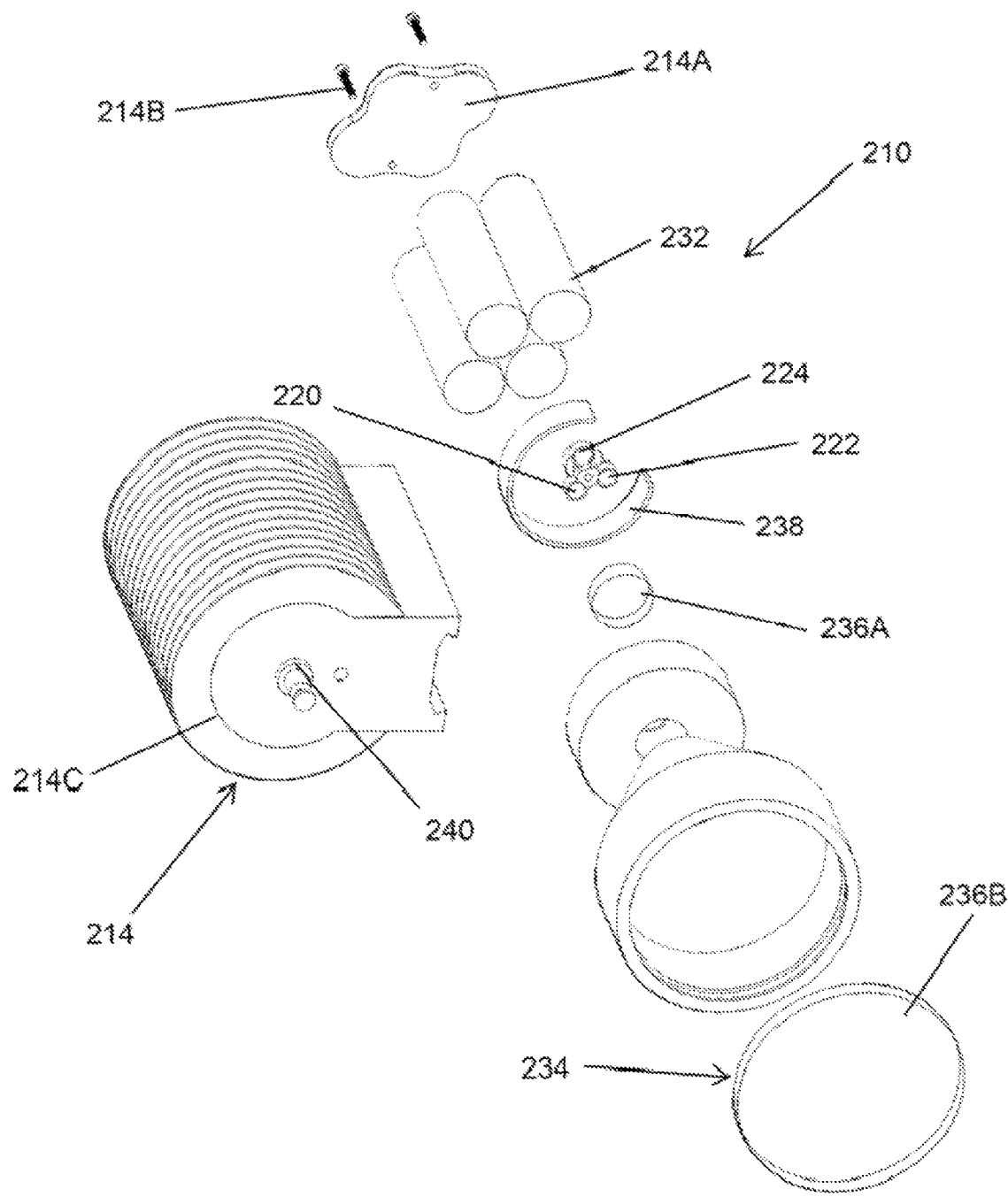
FIG. 2B is an exploded perspective view of the laser source assembly of FIG. 2A.

FIG. 2B is a partially exploded perspective view of the laser source assembly 210 of FIG. 2A. In particular, FIG. 2B illustrates the various features of the housing 214, and illustrates certain additional features and/or characteristics of the laser source assembly 210.

In the embodiment illustrated in FIG. 2B, the housing 214 includes a removable cover 214A that is selectively secured with a fastener assembly 214B (e.g., one or more bolts) to a housing body 214C of the housing 214. In one embodiment, the cover 214A is hermetically sealed to the housing body 214C in an air tight manner. Additionally, in this embodiment, multiple batteries 232 are positioned within the housing body 214C of the housing 214. As provided above, the batteries 232 provide power to the three laser sources 220, 222, 224 that are positioned within the housing 214.

FIG. 2B also illustrates that the laser source assembly 210 includes a curved printed circuit board 238 that is electrically connected to and directs power to the laser sources 220, 222, 224. With the curved printed circuit board 238, the circuit is in close proximity to the laser sources 220, 222, 224, which improves the overall efficiency of the laser source assembly 210. The printed circuit board 238 can include one or more processors and circuits that control the electron injection current to the individual laser sources 220, 222, 224.

Further, as illustrated in FIG. 2B, the laser sources 220, 222, 224 are secured to or otherwise coupled to a mounting base 240 or bench.

Moreover, FIG. 2B illustrates that the laser source assembly 210 includes a beam adjuster assembly 234 that is substantially similar to the beam adjuster assembly 34 illustrated and described above in relation to FIGS. 1A-1E. In one embodiment, the beam adjuster assembly 234 includes the diverging lens 236A that is used to expand the beams 226, 228, 230 (illustrated in FIG. 2C) from the three laser sources 220, 222, 224, and the assembly lens 236B that collimates these beams 226, 228, 230.

Figure 2C:
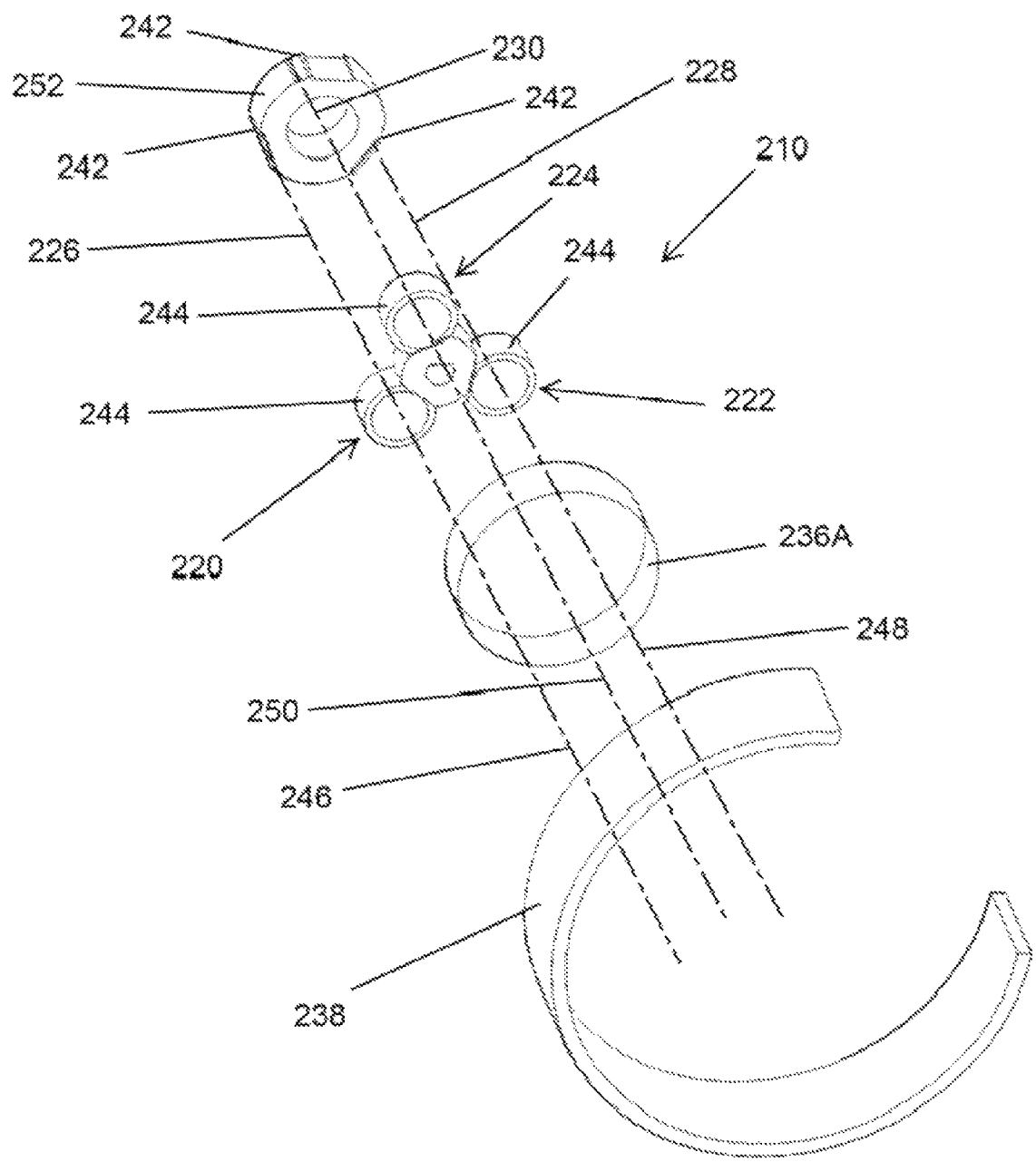
FIG. 2C is an enlarged perspective view of a portion of the laser source assembly of FIG. 2A.

FIG. 2C is an enlarged perspective view of a portion of the laser source assembly 210 of FIG. 2A. More specifically, FIG. 2C illustrates an enlarged view of the laser sources 220, 222, 224, the diverging lens 236A, and the printed circuit board 238. In this embodiment, each of the laser sources 220, 222, 224 again includes a gain medium 242, and a collimating lens 244 that are similar to the corresponding components described above. With this design, (i) the first laser source 220 generates and emits the first beam 226 that is directed along a first beam axis 246; (ii) the second laser source 222 generates and emits the second beam 228 that is directed along a second beam axis 248; and (iii) the third laser source 224 generates and emits the third beam 230 that is directed along a third beam axis 250. Further, the beams 226, 228, 230 are spaced apart from each other and are substantially parallel to each other. Moreover, the first beam axis 246, the second beam axis 248 and the third beam axis 250 are substantially parallel to and spaced apart from the assembly axis 212A (illustrated in FIG. 2A), and the first beam axis 246, the second beam axis 248 and the third beam axis 250 are positioned spaced apart from one another radially about the assembly axis 212A.

Further, in certain embodiments, the first beam axis 246, the second beam axis 248 and the third beam axis 250 can be positioned spaced apart from one another radially about and substantially equidistant from the assembly axis 212A.

Further, in the embodiment illustrated in FIG. 2C, the gain medium 242 of each laser source 220, 222, 224 is positioned on a common, annular shaped heat sink 252. In this embodiment, the heat sink 252 provides a rigid platform for fixedly mounting and maintaining the relative positions of the gain media 242, and the heat sink 252 is a rigid, one-piece, monolithic structure that is made of material having relatively high thermal conductivity. As provided herein, a high thermal conductivity material can thermally connect the heat sink 252 to the heat dissipater 216.

Moreover, in this embodiment, the gain media 242 are substantially equally spaced apart from one another around the perimeter of the heat sink 252. For example, the gain media 242 can be spaced apart approximately one hundred twenty degrees from one another around the perimeter of the heat sink 252. Alternatively, in an embodiment that includes four laser sources, the gain media 242 can be spaced apart approximately ninety degrees from one another around the perimeter of the heat sink 252. Still alternatively, as noted above, the laser source assembly 210 can have a different number of laser sources with the gain media 242 being substantially evenly spaced apart from one another around the perimeter of the heat sink 252, and/or the gain media 242 can have a different orientation relative to one another around the perimeter of the heat sink 252.

The amount of space between the beams 226, 228, 230 and the characteristics of each of the beams 226, 228, 230 in this embodiment can be similar to the design described above.

Figure 3:
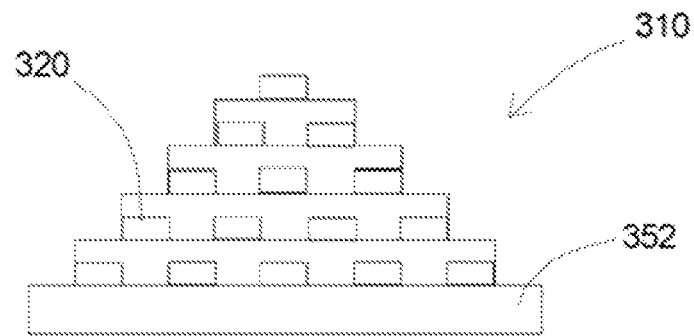
FIG. 3 is a simplified illustration of a portion of still another embodiment of a laser source assembly having features of the present invention.

FIG. 3 is a simplified illustration of a portion of still another embodiment of a laser source assembly 310 having features of the present invention. In this embodiment, the laser source assembly 310 includes five separate heat sinks 352 that are positioned in a somewhat pyramidal array, and fifteen individual laser sources 320 that are secured to the heat sinks 352. As illustrated in this embodiment, five laser sources 320 are thermally coupled to the lowest heat sink 352; four laser sources 320 are thermally coupled to the second to the lowest heat sink 352; three laser sources 320 are thermally coupled to the third to the lowest (or middle) heat sink 352; two laser sources 320 are thermally coupled to the fourth to the lowest (or second from the top) heat sink 352; and one laser source 320 is thermally coupled to the highest heat sink 352. In this embodiment, multiple laser sources 320 are again staggered on a common heat sink 352. It should be noted that the number of heat sinks 352 and the number of laser sources 320 shown in FIG. 3 is a non-exclusive example of one possible arrangement, and that the number and arrangement of the heat sinks 352 and the number of laser sources 320 can be different than that illustrated in FIG. 3.

Figure 4:
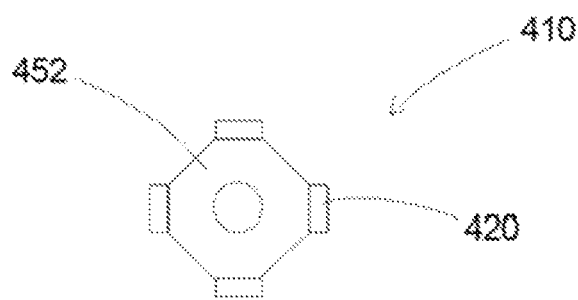
FIG. 4 is a simplified illustration of a portion of yet another embodiment of a laser source assembly having features of the present invention.

FIG. 4 is a simplified illustration of a portion of yet another embodiment of a laser source assembly 410 having features of the present invention. The laser source assembly 410 illustrated in FIG. 4 is somewhat similar to the laser source assembly 210 illustrated and described above in relation to FIGS. 2A-2C. However, in the embodiment illustrated in FIG. 4, the laser source assembly 410 includes a single common, annular shaped heat sink 452, and four individual laser sources 420 that are secured to the heat sink 452. In this embodiment, multiple laser sources 420 are again staggered on the common heat sink 452. It should be noted that the laser sources 420 on the single common heat sink 452 shown in FIG. 4 is one non-exclusive example, and that the number and arrangement of the laser sources 420 on the heat sink 452 can be different than that illustrated in FIG. 4.

Additionally, in this embodiment, each of the laser sources 420 generates and/or emits a beam (not illustrated) that is directed along a beam axis (not illustrated), with each of the beam axes being parallel to and spaced apart from each other. Moreover, the beam axes are substantially parallel to and spaced apart from the assembly axis 12A (illustrated in FIG. 1A), and the beam axes are positioned spaced apart from one another radially about the assembly axis 12A. In one non-exclusive embodiment, the beam axes are positioned substantially evenly spaced apart from one another radially about the assembly axis 12A. In such embodiment, with four laser sources 420, the first beam axes are positioned approximately ninety degrees from one another radially about the assembly axis 12A. Further, in one embodiment, the beam axes can be positioned spaced apart from one another radially about and substantially equidistant from the assembly axis 12A.

Figure 5:
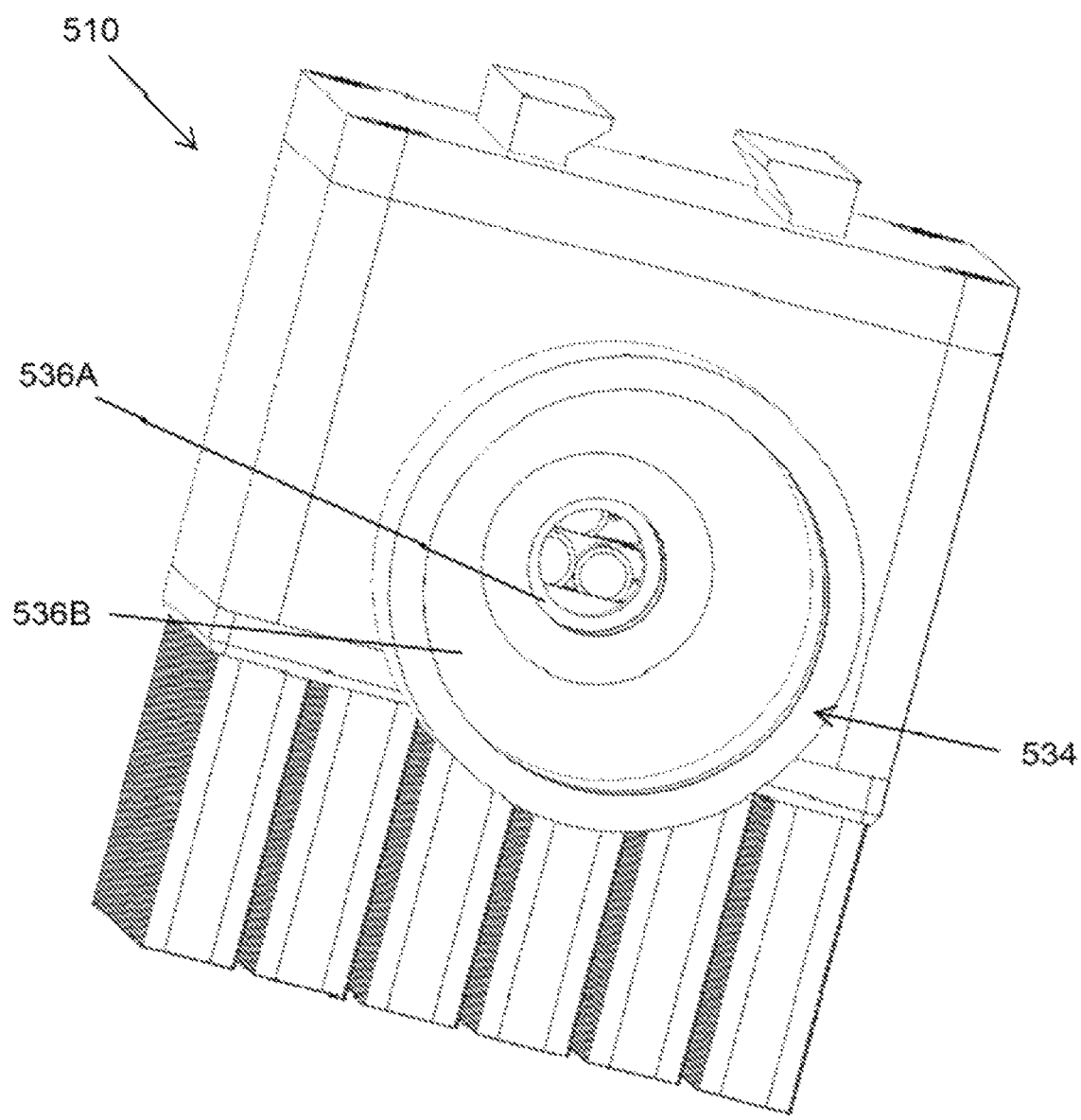
FIG. 5 is a perspective view of still another embodiment of a laser source assembly having features of the present invention.

FIG. 5 is a perspective view of still another embodiment of a laser source assembly 510 having features of the present invention. The laser source assembly 510 illustrated in FIG. 5 is somewhat similar to the laser source assembly 10 illustrated and described above in relation to FIGS. 1A-1E. However, in the embodiment illustrated in FIG. 5, the beam adjuster assembly 534 is smaller in diameter than the beam adjuster assembly 34 described above. More particularly, each of the diverging lens 536A and the assembly lens 536B of the beam adjuster assembly 534 are smaller in diameter than the diverging lens 36A and the assembly lens 36B, respectively, described above.

Figure 6A:
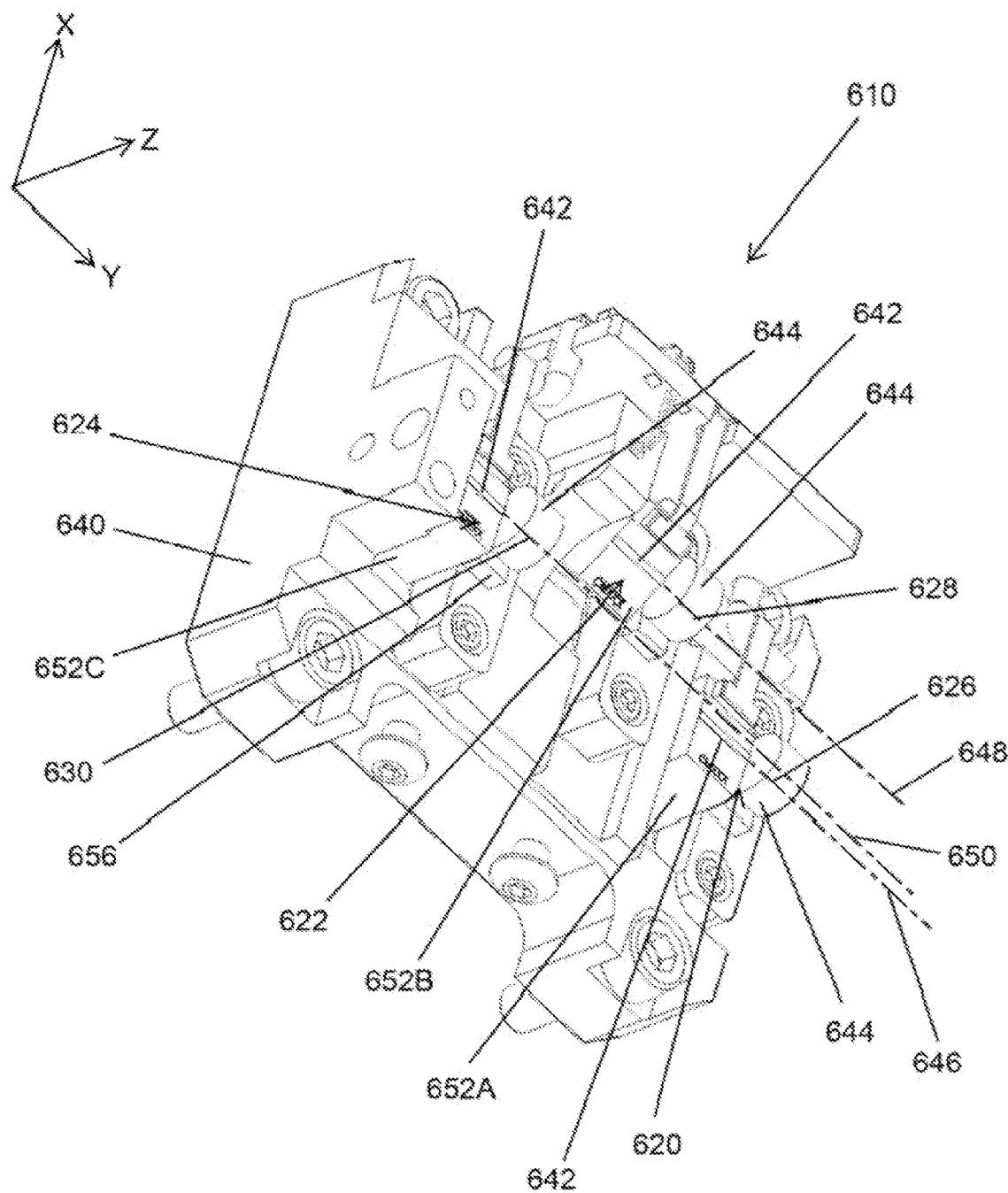
FIG. 6A is a perspective view of a portion of yet another embodiment of a laser source assembly having features of the present invention.

FIG. 6A is a perspective view of a portion of yet another embodiment of a laser source assembly 610 having features of the present invention. The laser source assembly 610 illustrated in FIG. 6A is somewhat similar to the laser source assembly 10 illustrated and described above in relation to FIGS. 1A-1E. As with the previous embodiments, each laser source 620, 622, 624 includes a gain medium 642, and a collimating lens 644 that are somewhat similar to the corresponding components described above.

Figure 6B:
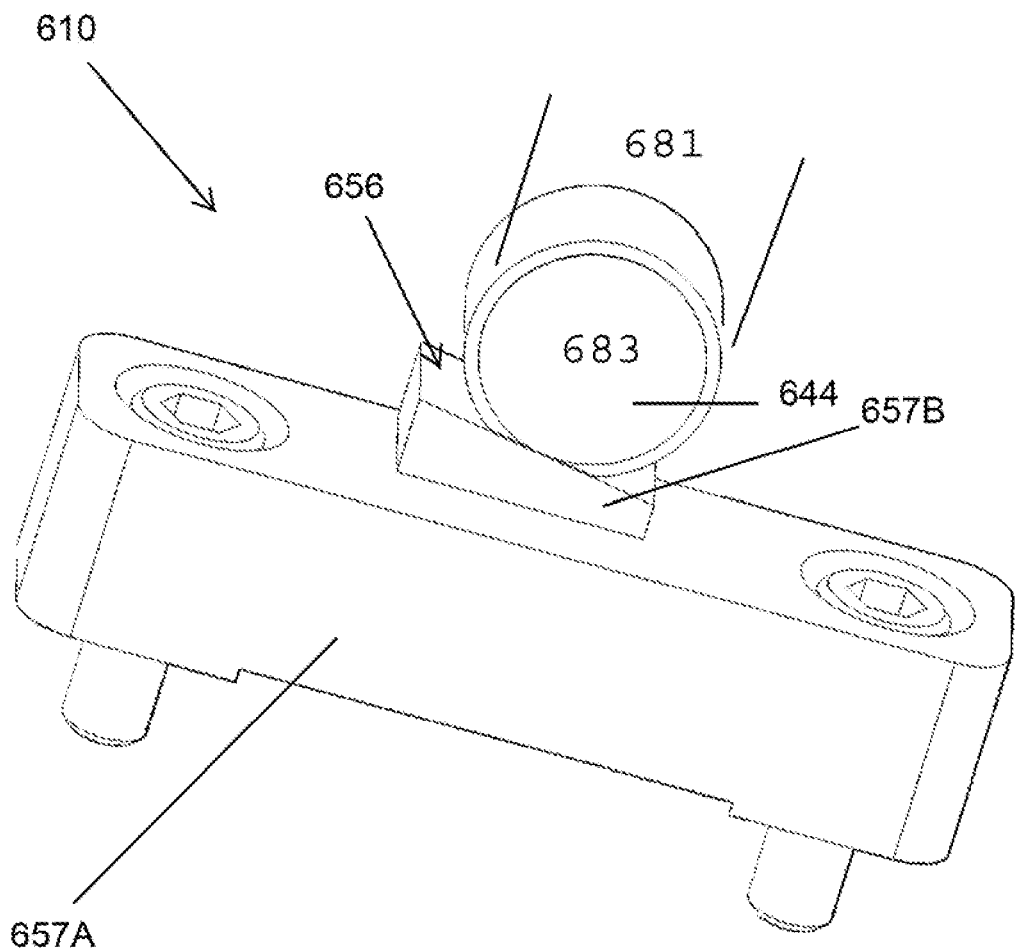
FIG. 6B is a perspective view of a portion of the laser source assembly of FIG. 6A.

However, in the embodiment illustrated in FIG. 6A, the gain medium 642 of each laser source 620, 622, 624 is secured with a separate heat sink, i.e. a first heat sink 652A, a second heat sink 652B, and a third heat sink 652C, respectively to the mounting base 640. Stated another way, the gain medium 642 of the first laser source 620 is secured with the first heat sink 652A to the mounting base 640, the gain medium 642 of the second laser source 622 is secured with the second heat sink 652B to the mounting base 640, and the gain medium 642 of the third laser source 624 is secured with the third heat sink 652C to the mounting base 640. In FIG. 6B, the second heat sink 652B is angled so that the first beam 626 from the first laser source 620 is not blocked by the second heat sink 652B and the beams 626, 628, 630 are directed in close proximity to each other.

Additionally, in this embodiment, each of the heat sinks 652A, 652B, 652C is individually secured to the mounting base 640. Further, each of the heat sinks 652A, 652B, 652C is positioned on the mounting base 640 so that (i) the first laser source 620 emits the first beam 626 along the first beam axis 646, (ii) the second laser source 622 emits the second beam 628 along the second beam axis 648, and (iii) the third laser source 624 emits the third beam 630 along the third beam axis 650; and the beam axes 646, 648, 650 are parallel to and spaced apart from one another.

Further, in this embodiment, each collimating lens 644 is secured to the mounting base 640 with a lens mounting assembly 656. FIG. 6B is a perspective view of a portion of the laser source assembly 610 of FIG. 6A. In particular, FIG. 6B illustrates one of the collimating lenses 644 and its lens mounting assembly 656. In this embodiment, the lens mounting assembly 656 includes a mount frame 657A and a height compensator 657B. In this embodiment, the mount frame 657A is generally rectangular shaped and is secured to the mounting base 640 (illustrated in FIG. 6A) and the position compensator 657B that allows for the position of the collimating lens 644 to be adjusted. In one embodiment, the position compensator 657B is somewhat wedged shaped. Alternatively, the position compensator 657B can have a different configuration than that illustrated in FIG. 6B.

With this design, referring to both FIGS. 6A and 6B, the gain medium 642 for the first laser source 620 is secured to the mounting base 640. Next, the lens 644 for the first laser source 620 is positioned coaxial with the first beam axis 646 above its mount frame 657A. Subsequently, glue can be positioned on each side of the position compensator 657B and the position compensator 657B can be slid into the gap between the lens 644 and the mount frame 657A until the position compensator 657B fills the gap. Subsequently, the glue can be cured so that this lens 644 is properly positioned. This process can be repeated for the other laser sources 622, 624.

Figure 7A:
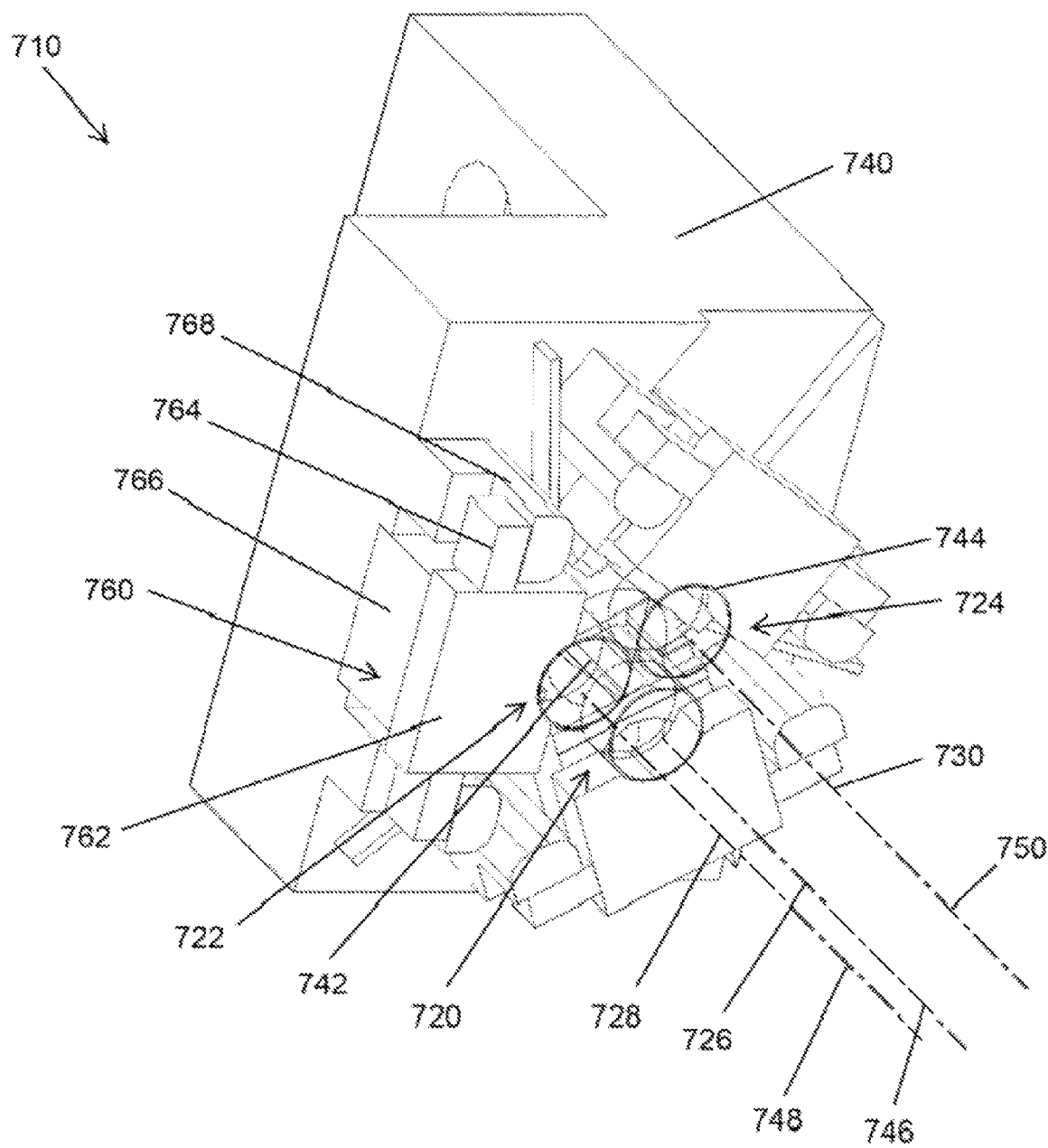
FIG. 7A is a perspective view of a portion of still yet another embodiment of a laser source assembly having features of the present invention.

FIG. 7A is a perspective view of a portion of still yet another embodiment of a laser source assembly 710 having features of the present invention. The laser source assembly 710 illustrated in FIG. 7A is somewhat similar to the laser source assemblies illustrated and described above. For example, in the embodiment illustrated in FIG. 7A, the laser source assembly 710 includes three laser sources, i.e. a first laser source 720, a second laser source 722, and a third laser source 724, with each of the laser sources 720, 722, 724 including a gain medium 742 and a collimating lens 744 that are similar to the corresponding components described above.

Similarly, the first laser source 720 generates the first beam 726, the second laser source 722 generates the second beam 728, and the third laser source 724 generates the third beam 630, that are each directed along a corresponding beam axis 746, 748, 750, with the beam axes 746, 748, 750 being parallel to and spaced apart from one another in a compact array. Moreover, the first beam axis 746, the second beam axis 748 and the third beam axis 750 are substantially parallel to and spaced apart from an assembly axis, e.g., the assembly axis 12A illustrated in FIG. 1A, and the first beam axis 746, the second beam axis 748 and the third beam axis 750 are positioned spaced apart from one another radially about the assembly axis 12A.

However, in this embodiment, the laser sources 720, 722, 724 are coupled to the mounting base 740 in a different manner, and the mounting base 740 has a different shape, i.e. the mounting base 740 is substantially L-shaped. In particular, in the embodiment illustrated in FIG. 7A, each of the laser sources 720, 722, 724 is coupled to the mounting base 740 with a mounting assembly 760. As will be described in greater detail below, the mounting assembly 760 for each of the laser sources 720, 722, 724 includes a mounting block 762, a pair of block arms 764, a mounting frame 766, and a pair of base connectors 768.

Figure 7B:
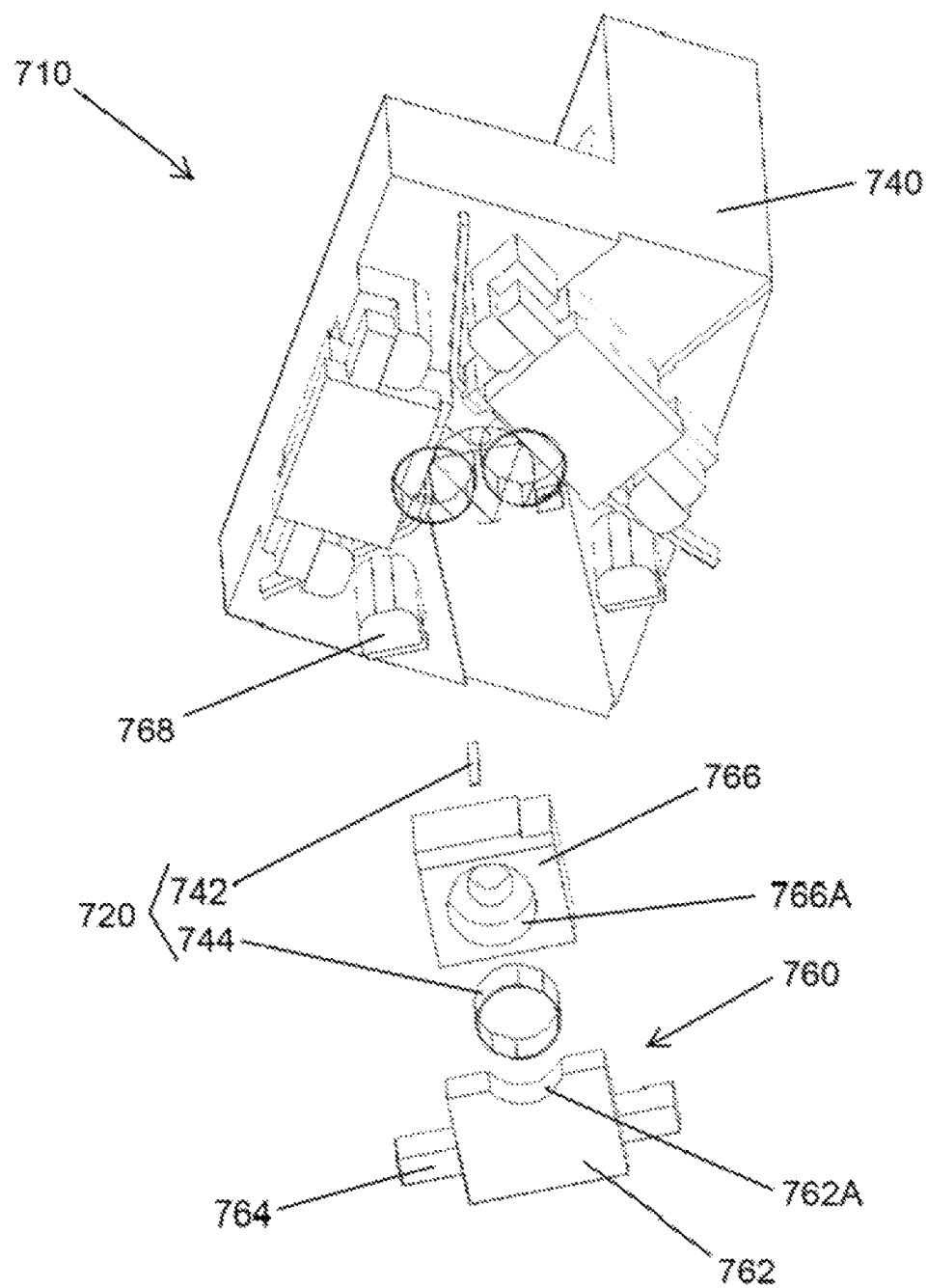
FIG. 7B is a partially exploded perspective view of the portion of the laser source assembly of FIG. 7A.

FIG. 7B is a partially exploded perspective view of the portion of the laser source assembly 710 of FIG. 7A. More particularly, FIG. 7B includes the first laser source 720 and a portion of the corresponding mounting assembly 760 being exploded away from the remainder of the laser source assembly 710. Accordingly, various details of one embodiment of the mounting assembly 760 are clearly illustrated in FIG. 7B.

As provided above, the first laser source 720 includes a gain medium 742 and a collimating lens 744, and the mounting assembly 760 includes the mounting block 762, the pair of block arms 764, the mounting frame 766, and the pair of base connectors 768.

As illustrated in FIG. 7B, the mounting block 762 is substantially rectangular block shaped and includes an arc-shaped block notch 762A that is sized and shaped to receive a portion of the collimating lens 744. Alternatively, the mounting block 762 can have a different design.

In certain embodiments, the collimating lens 744 is secured to the mounting block 762, with a portion of the collimating lens 742 being positioned substantially within the block notch 762A. In one such embodiment, the collimating lens 744 is secured to the mounting block 762 utilizing a glue that is transparent to ultraviolet light. Alternatively, the collimating lens 744 can be secured to the mounting block 762, i.e. substantially within the block notch 762A, in a different manner.

In this embodiment, the pair of block arms 764 are substantially rectangular block shaped and are secured to and extend away from opposing edges of the mounting block 762. In certain embodiments, the block arms 764 are fixedly secured to the opposing edges of the mounting block 762. For example, in one such embodiment, the block arms 764 are fixedly secured to the opposing edges of the mounting block 762 utilizing a glue that is transparent to ultraviolet light. Alternatively, the block arms 764 can be fixedly secured to the opposing edges of the mounting block 762 in a different manner. Still alternatively, the block arms 764 can be integrally formed with the mounting block 762.

Additionally, the block arms 764 are positioned to engage the base connectors 768 so that the collimating lens 744 can be properly positioned relative to the QC medium 742 and relative to the mounting base 740 i.e. so that the collimating lens 742 is positioned coaxial with the first beam axis 746 (illustrated in FIG. 7A).

As illustrated in FIG. 7B, the mounting frame 766 is substantially square block shaped and includes a frame aperture 766A. Alternatively, the mounting frame 766 can have a different design.

In this embodiment, the frame aperture 766A in substantially circular and has a stepped design. More specifically, the frame aperture 766A includes (i) a first, larger section that is sized and shaped to receive a portion of the collimating lens 744, and (ii) a second, smaller section such that the QC medium 742 can be positioned within, can extend through, and/or can emit a beam that is directed through the smaller section of the frame aperture 766A.

Additionally, in certain embodiments, the mounting frame 766 can be fixedly secured to the mounting block 762 and to the mounting base 740. For example, in one such embodiment, the mounting frame 766 can be fixedly secured to the mounting block 762 and to the mounting base 740 utilizing a glue that is transparent to ultraviolet light. Alternatively, the mounting frame 766 can be fixedly secured to the mounting block 762 and to the mounting base 740 in a different manner. Still alternatively, the mounting frame 766 can be integrally formed with the mounting block 762 and/or with the mounting base 740.

As shown in the embodiment illustrated in FIG. 7B, the base connectors 768 can be somewhat L-shaped blocks that cantilever away from the mounting base 740. In some embodiments, the base connectors 768 can be fixedly secured to the mounting base 740 and/or the base connectors 768 can be integrally formed with the mounting base 740. In one non-exclusive embodiment, one or more of the base connectors 768 are fixedly secured to the mounting base 740 utilizing a glue that is transparent to ultraviolet light.

The base connectors 768 are positioned to engage the block arms 764 so as to appropriately position the mounting block 762 and, thus, the collimating lens 744 relative to the QC medium 742 and relative to the mounting base 740, i.e. so that het collimating lens 742 is positioned coaxial with the first beam axis 746. In certain embodiment, the block arms 764 are fixedly secured to the base connectors 768. For example, in one such embodiment, the block arms 764 are fixedly secured to the base connectors 768 utilizing a glue that is transparent to ultraviolet light. Alternatively, the block arms 764 can be fixedly secured to the base connectors 768 in a different manner.

Figure 7C:
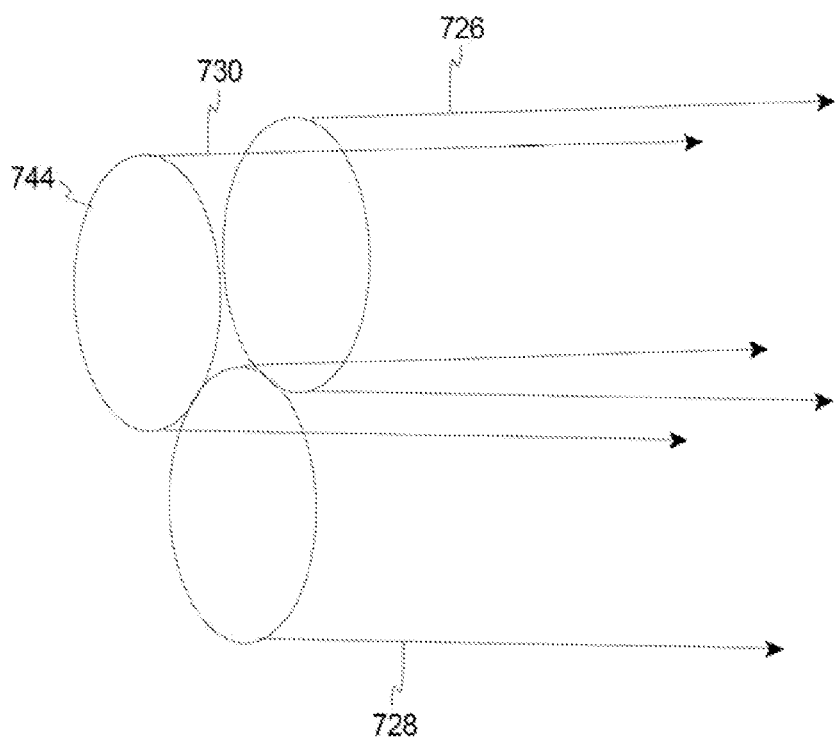
FIG. 7C illustrates the three collimated beams exiting the lens and propagating substantially parallel to each other.
Figure 7D:
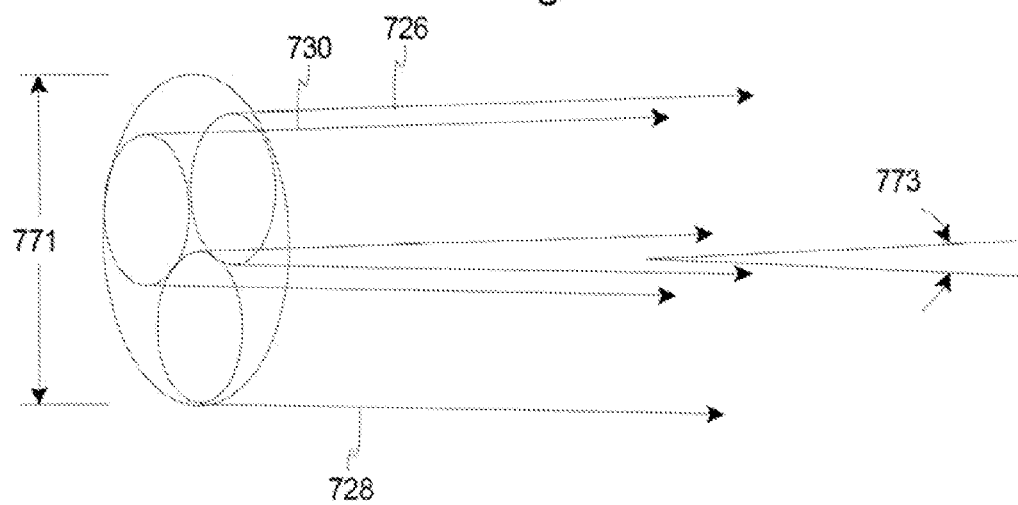
FIG. 7D illustrates an overall diameter of the combined beams.

FIG. 7C illustrates the three collimated beams 726, 728, 730 exiting the lens 744 and propagating substantially parallel to each other. FIG. 7D illustrates an overall diameter 771 of the combined beams 726, 728, 730 and a beam divergence 773. Beam Parameter Product ("BPP") is defined by Beam Radius times Beam Divergence. For a given beam divergence 773, the minimum BPP, which defines the best achievable beam quality, is achieved by minimizing gaps between the collimated beams 726, 728, 730 (beams as close as possible to each other), thereby minimizing the overall diameter 771. As provided herein, the beam quality of the assembly output beam 12 (illustrated in FIG. 1) created by the beams 726, 728, 730 that are substantially parallel to each other, is defined by the wavelengths of the individual beams 726, 728, 730; the radius of the beam 726, 728, 730 at the waist; spacing of the beams 726, 728, 730; and the far field beam divergence of the individually collimated beams 726, 728, 730.

Furthermore, for the embodiments provided herein, a Numerical Aperture of each lens 744 is chosen to approximately match a Numerical Aperture of its respective beam 726, 728, 730. More specifically, (i) the Numerical Aperture of the first lens 744 approximately matches the Numerical Aperture of the first beam 726, (ii) the Numerical Aperture of the second lens 744 approximately matches the Numerical Aperture of the second beam 728, and (iii) the Numerical Aperture of the third lens 744 approximately matches the Numerical Aperture of the third beam 726. Stated in another fashion, each lens 744 is designed to have an acceptance angle that approximately matches a cone of its respective beam 726, 728, 730. This results in the most compact system, and has the further advantage of maximizing the beam size relative to the lens diameter.

For the case of all beams 726, 728, 730 having the same wavelengths, beam waist radii, and divergences, the beam quality may be defined in mm-mRad, whose values are the product of the ensemble beam radius multiplied by the divergence of any particular beam. The best BPP is defined by the smallest achievable product of divergence times the ensemble beam diameter. For any given beam divergence, the best BPP is achieved by placing all beams 726, 728, 730 in the closest possible proximity, as this results in the minimum diameter 771.

Referring back to FIG. 6B, in certain embodiments, each collimated lens 644 is uniquely designed so that an outer diameter 681 of the collimating lens 644 is approximately equal to a clear aperture 683 of the lens 644. In alternative, non-exclusive embodiments, the clear aperture 683 is at least approximately 80, 85, 90, or 95 of the size of the outer diameter 681 of the collimating lens. With this design, the beams can be placed really close to each other because that non-working part of the lens 644 is relatively small.

FIG. 8 is a simplified side view of an embodiment of a weapon assembly 800 having features of the present invention. In particular, FIG. 8 is a simplified side view of a weapon 802 which utilizes a thermal imager 804 and a thermal pointer 810 having features of the present invention. The thermal pointer 810, as used with the weapon 802 illustrated in FIG. 8, can have features in common with one or more of the embodiments of the laser source assembly illustrated and described herein above. Additionally, as noted above, the weapon 802 can be used, by effectively utilizing the features of the thermal imager 804 and the thermal pointer 810, to locate, designate, and/or aim at one or more targets 806.

In one embodiment, the thermal imager 804 detects radiation in the infrared range of the electromagnetic spectrum and produces images of that radiation, called thermograms. Further, the thermal imager 804 is able to detect a spot that is illuminated on the target 806 with the thermal pointer 810.

Additionally, as illustrated in FIG. 8, the thermal imager 804 and the thermal pointer 810 are secured to or otherwise coupled to the weapon 802 via a pointer mount 818. In one embodiment, the pointer mount 818 is a thermal insulator mount that secures the thermal imager 804 and/or the thermal pointer 810 to the weapon 802. In such embodiment, the pointer mount 818 inhibits the transfer of heat between the weapon 802 and the thermal pointer 810. Alternatively, the pointer mount 818 can have a different design.

In the embodiment illustrated in FIG. 8, the thermal imager 804 and the thermal pointer 810 are illustrated as being mounted on the weapon 802 as a single integrated unit. Alternatively, the thermal imager 804 and the thermal pointer 810 can be separate from one another, and the thermal imager 804 and the thermal pointer 810 can be mounted individually on the weapon 802.

It should be noted that the thermal imager 804 and the laser source assembly 840 can be referred to collectively as a targeting assembly. In one embodiment of the targeting assembly, the refresh rate of the thermal imager 804 can correspond to the pulsing of one or more of the gain media of the thermal pointer 810. Stated in another fashion, the pulses of the thermal pointer 810 can be pulsed in conjunction with the refresh rate of the thermal imager 804.

In certain embodiments, the targeting assembly can include one or more features that enhance the image that is displayed on the thermal imager 804. For example, the targeting assembly can utilize background subtraction to enhance the image displayed on the display of the thermal imager 804. With background subtraction, the thermal imager 804 captures a first image of the area with the thermal pointer 810 pointed at the target 806 and a second image without the thermal pointer 810 directing the assembly output beam, e.g., the assembly output beam 12 illustrated in FIG. 1A, into the area. Subsequently, an adjusted image can be generated by subtracting the second image from the first image.

In one embodiment, the area that is in the path of the assembly output beam can be identified with the adjusted image utilizing background subtraction. Next, the thermal imager 804 can display a red dot image that includes the first image plus a red dot that represents the area that is in the path of the assembly output beam (identified with the adjusted image). With this design, the person viewing the red dot image can easily and quickly identify the area targeted with the thermal pointer 810. It should be noted that colors other than red can be utilized.

In another example, the thermal imager 804 can include a polarization filter on its input that reduces the amount of unpolarized light that reaches the sensor of the thermal imager 804. In certain embodiments, as provided herein, the assembly output beam from the thermal pointer 810 is highly polarized. With this design, the thermal imager 804 will be able to distinguish between scattered laser light that is polarized and the background light that is usually unpolarized. In still another embodiment, the present invention can utilize other polarization techniques that will enhance the target 806 viewed on the thermal imager 804.

In yet another embodiment, one or more of the laser sources of the thermal pointer 810 can generate light in a visible range. With this design, the assembly output beam can include multiple different wavelengths (including infrared wavelengths and visible wavelengths), and the thermal imager 804 can capture and/or display an image that includes the infrared wavelengths and/or the visible wavelengths.

It should be noted that other post processing techniques can be used for the thermal imager 804. As an example, the contrast of the thermal imager 804 can be adjusted to improve the image provided by the thermal imager 804.

In certain embodiments, a portion of the assembly output beam can be absorbed/re-emitted by the target 806 after the assembly output beam is no longer on the target 806. In this embodiment, the target spot can be visible for a period of time with the thermal imager 804 even after the assembly output beam is no longer on the target 806. The length of such period of time will depend on the characteristics of the target 806, the environment, and the assembly output beam. In certain embodiments, the assembly output beam can have wavelengths in the ultra-violet, the visible, the near infrared, the mid infrared and/or the long wave infrared range. Stated in another fashion, in certain embodiments, the assembly output beam can include wavelengths in the 0.2 to 20 micron range.

Figure 9:
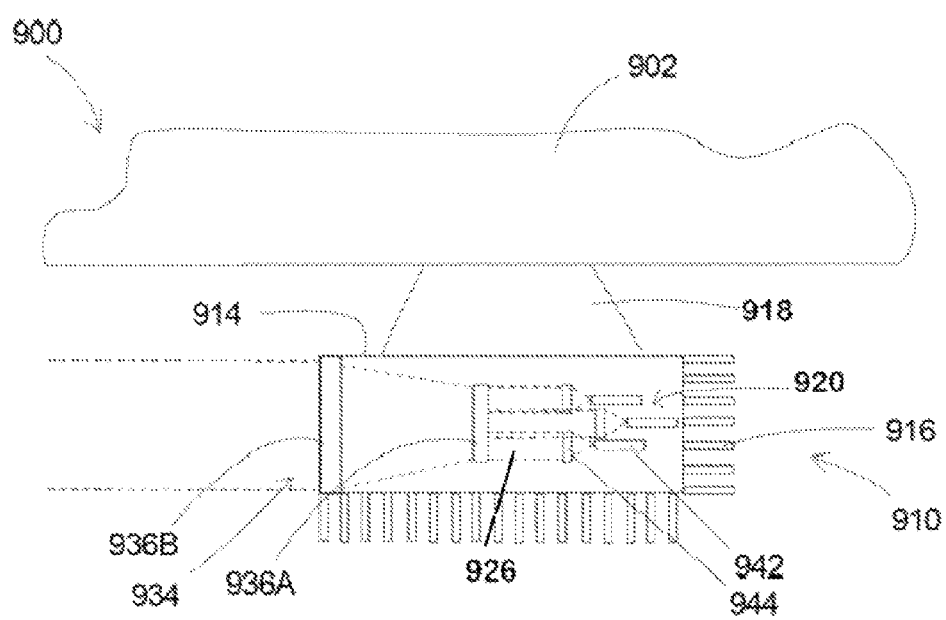
FIG. 9 is a simplified side view of a portion of another weapon assembly having features of the present invention.

FIG. 9 is a simplified side view of a portion of another weapon assembly 900 having features of the present invention. In particular, FIG. 9 illustrates a portion of a weapon 902, a pointer mount 918, and a thermal pointer 910.

The weapon assembly 900 illustrated in FIG. 9 can be somewhat similar to the weapon assembly 800 illustrated and described above in FIG. 8. As with the previous embodiment, the pointer mount 918 can be a thermal insulator mount that secures the thermal pointer 910 to the weapon 902. In such embodiment, the pointer mount 918 has relatively low thermal conductivity and inhibits the transfer of heat between the weapon 902 and the thermal pointer 910. With this design, the temperature of the weapon 902 (either hot or cold) will not adversely influence the operation of the thermal pointer 910. Alternatively, the pointer mount 918 can have a different design.

As shown in the embodiment illustrated in FIG. 9, the thermal pointer 910 includes three laser sources 920, with each laser source 920 including a gain medium 942 and a collimating lens 944. Alternatively, the thermal pointer 910 can include greater than or fewer than three laser sources 920.

The gain medium 942 of each laser source 920 generates and emits a beam 926, such that each beam 926 is parallel to and spaced apart from each of the other beams 926. Additionally, each collimating lens 944 is positioned between the gain medium 942 and the beam adjuster assembly 934. In this embodiment, the beam adjuster assembly 934 is substantially similar to the beam adjuster assemblies illustrated and described above, and includes the diverging lens 936A and the assembly lens 936B.

Additionally, the thermal pointer 910 further includes a housing 914 and a heat dissipater 916. The housing 914 encircles and/or encloses many of the elements of the thermal pointer 910. Further, the housing 914 can be made of a material of relatively high thermal conductivity to readily transfer heat from the gain media 942 to the heat dissipater 916 and generally away from the weapon 902. For example, the heat dissipater 916 can be a fin assembly.

Figure 10A:
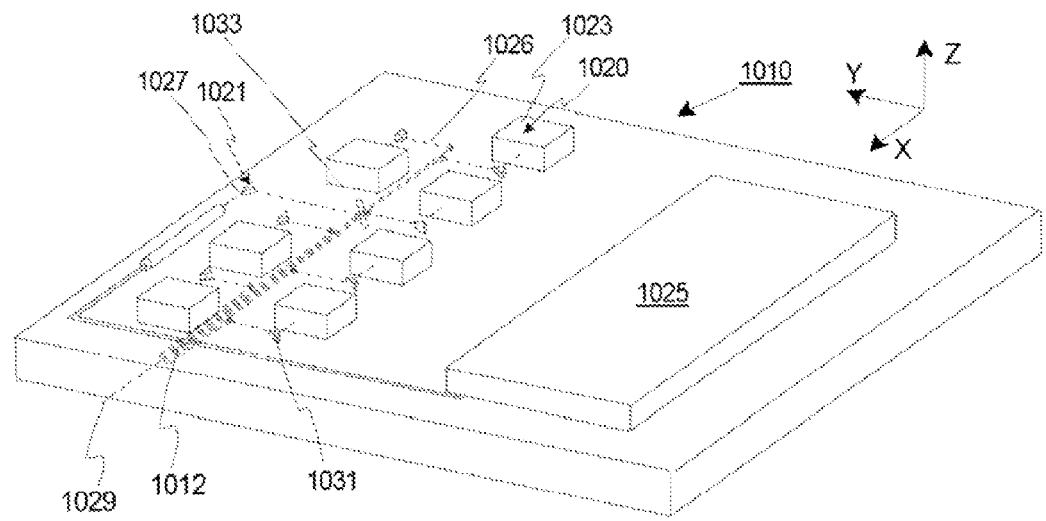
FIG. 10A is a perspective view of another embodiment of a laser source assembly having features of the present invention.
Figure 10B:
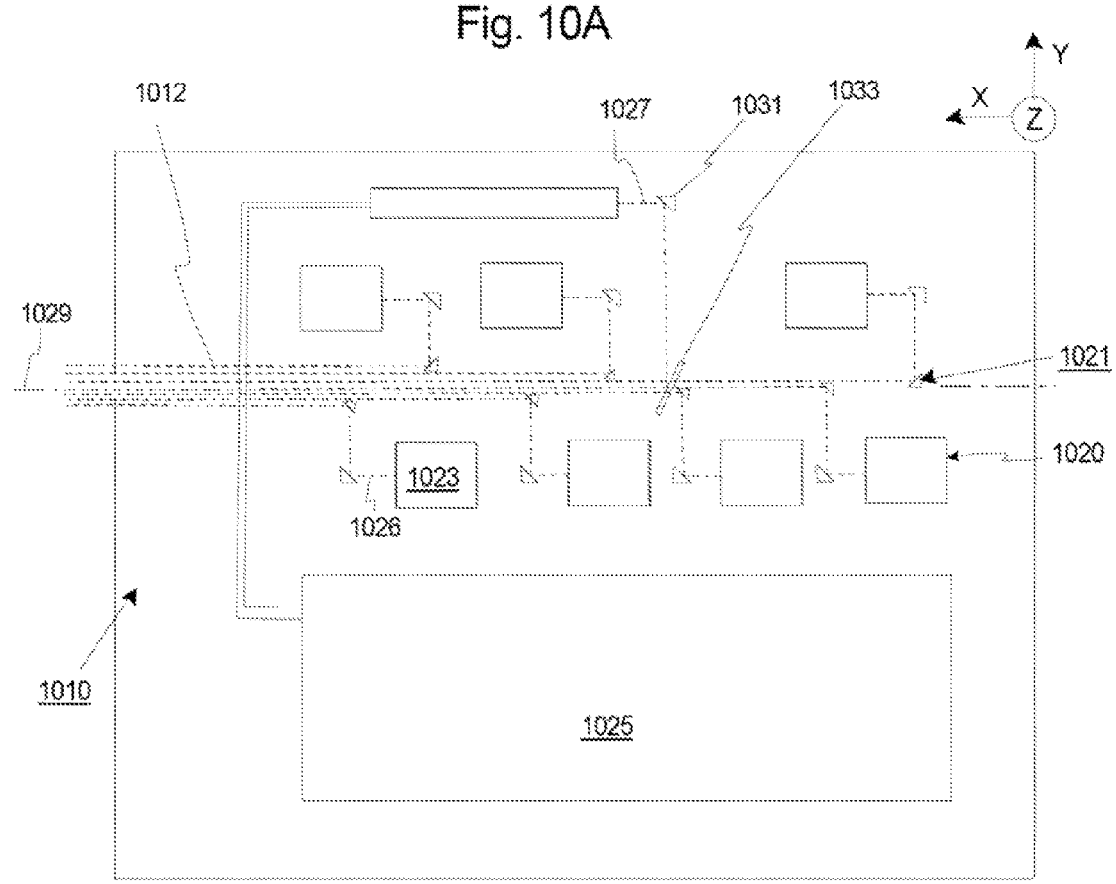
FIG. 10B is a top view of the laser source assembly of FIG. 10A.

FIG. 10A is a simplified perspective view and FIG. 10B is a simplified top view of another embodiment of a laser source assembly 1010 having features of the present invention that generates an assembly output beam 1012 (illustrated as dashed lines) that can be used as a thermal pointer. In this embodiment, the assembly output beam 1012 can be adjusted by a beam adjuster assembly (not shown) that can be somewhat similar to that illustrated in FIGS. 1A-1D). In this embodiment, the laser source assembly 1010 includes a plurality of laser sources 1020, and a beam director assembly 1021.

The number and design of the laser sources 1020 can be varied to achieve the desired characteristics of the assembly output beam 1012. In FIGS. 10A and 10B, the laser source assembly 1010 includes eight separate laser sources 1020. In this embodiment, seven of the laser sources 1020 are MIR laser sources 1023, and one of the laser sources 1020 is a non-MIR laser source 1025. Alternatively, the laser source assembly 1010 can be designed to have more or fewer than seven MIR laser sources 1023, and/or more than one or zero non-MIR laser sources 1025. It should be noted that the power output and other characteristics of the assembly output beam 1012 can be adjusted by changing the number of laser sources 1020.

In this embodiment, each MIR laser sources 1020 generates a MIR beam 1026 that is in the MIR range, and the non-MIR source 1025 generates a non-MIR beam 1027 that is outside the MIR range. A suitable MIR laser source 1023 includes a QC gain medium (not shown) and a collimating lens (not shown) as described above. A suitable non-MIR laser source 1025 can be a diode-pumped Thulium-doped fiber laser.

In this embodiment, the beam director assembly 1021 directs the beams 1026, 1027 so that they are parallel to each other, and are adjacent to or overlapping each other. As provided herein, in one embodiment, the beam director assembly 1021 directs the MIR beams 1026 and the non-MIR beam 1027 in a substantially parallel arrangement with a combiner axis 1029. Stated in another fashion, the beam director assembly 1021 combines the MIR beams 1026 and the non-MIR beam 1027 by directing the beams 1026, 1027 to be parallel to each other (e.g. travel along parallel axes). Further, beam director assembly 1021 causes the MIR beams 1026 and the non-MIR beam 1027 to be directed in the same direction, with the beams 1026, 1027 overlapping, or are adjacent to each other.

In one embodiment, the beam director assembly 1021 can include a pair of individually adjustable beam directors 1031 for each MIR laser source 1023, and a dichroic filter 1033 (or polarization filter). Each beam director 1031 can be beam steering prism. Further, the dichroic filter 1033 can transmit beams in the MIR range while reflecting beams in the non-MIR range.

In this embodiment, the individual MIR beams 1026 and the non-MIR beam 1027 are steered to co-propagate parallel to each other at the distance between the beam centers of each MIR beams 1026 being close to the individual beam diameter of each MIR beams 1026. With this design, the beams 1026, 1027 propagate along parallel axes.

Figure 10C:
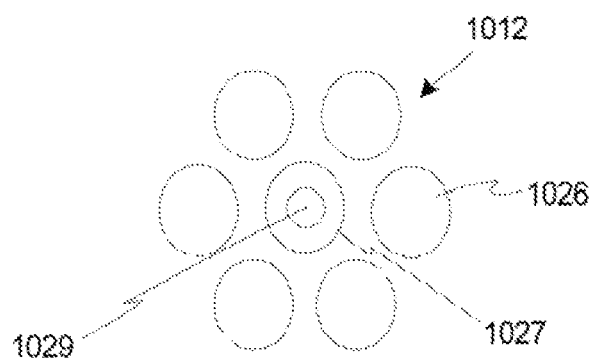
FIG. 10C is a simplified illustration of a plurality of beams.

FIG. 10C is a simplified illustration of the combined beams 1026, 1027 of the assembly beam 1012. In this embodiment, the center MIR beam 1026 and the non-MIR beam 1027 are coaxial with the combiner axis 1029, and the other MIR beams 1026 encircle the center MIR beam 1026.

Figure 11:
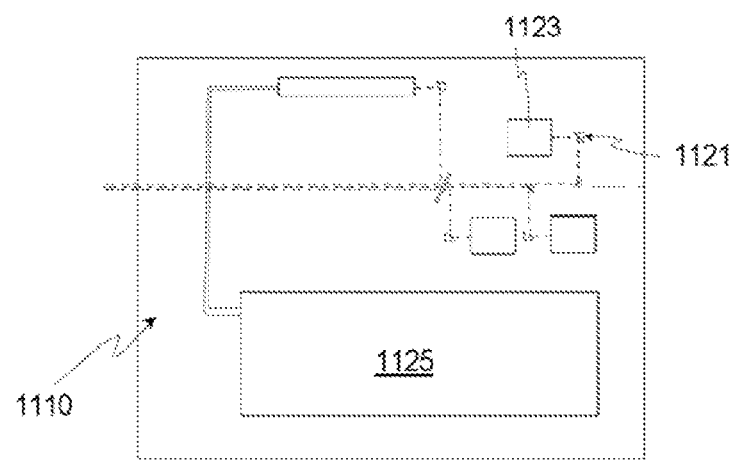
FIG. 11 is a simplified illustration of another embodiment of a laser source assembly having features of the present invention.

FIG. 11 is a simplified illustration of a portion of another embodiment of a laser source assembly 1110 that includes (i) three MIR laser sources 1123 and a non-MIR laser source 1125 that are similar to the corresponding components described above, and (ii) a beam director assembly 1121 that is similar to the corresponding components described above.

Figure 12A:
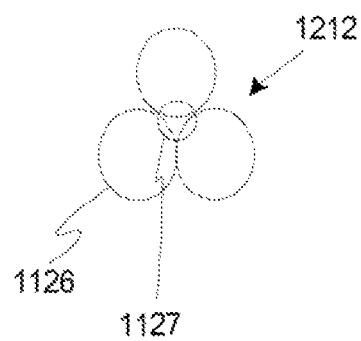
FIGS. 12A-12C are simplified alternative illustrations of a plurality of beams.

FIG. 12A is a simplified illustration of the combined plurality of MIR beams 1226 and the non-MIR beam 1227 of the assembly beam 1212. In this embodiment, the beam director assembly 1121 (illustrated in FIG. 11) has been positioned so that the three MIR beams 1226 are arranged in a triangular orientation and the non-MIR beam 1227 is positioned in the center of the triangular orientation.

Figure 12B:
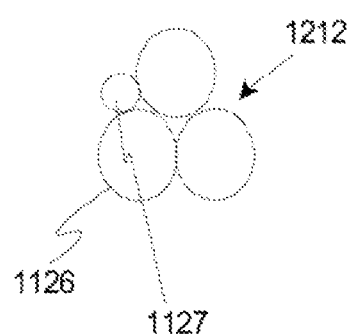

FIG. 12B is a simplified illustration of the combined plurality of MIR beams 1226 and the non-MIR beam 1227 of the assembly beam 1212. In this example, the beam director assembly 1121 (illustrated in FIG. 11) has been positioned so that the three MIR beams 1226 are arranged in a triangular orientation and the non-MIR beam 1227 is positioned outside the triangular orientation.

Figure 12C:
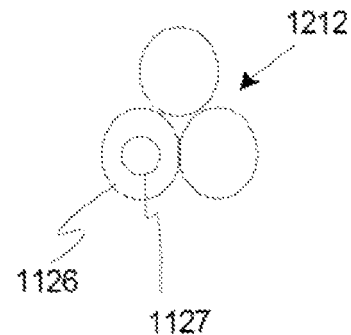

FIG. 12C is a simplified illustration of the combined plurality of MIR beams 1226 and the non-MIR beam 1227 of the assembly beam 1212. In this example, the beam director assembly 1121 (illustrated in FIG. 11) has been positioned so that the three MIR beams 1226 are arranged in a triangular orientation and the non-MIR beam 1227 is positioned to be overlapping one of the MIR beams 1226.

With the present designs as described in detail above, multiple gain media are used to provide an assembly output beam having sufficient power and the desired spectral characteristics. Additionally, as noted above, in certain embodiments, power to the multiple gain media can be pulsed so that an active portion of each gain media is maintained relatively cool with passive cooling. This allows each gain media to operate efficiently.

While a number of exemplary aspects and embodiments of a laser source assembly 10 have been discussed above, those of skill in the art will recognize certain modifications, permutations, additions and sub-combinations thereof. It is therefore intended that the following appended claims and claims hereafter introduced are interpreted to include all such modifications, permutations, additions and sub-combinations as are within their true spirit and scope.

What is claimed is:

1. A laser source assembly for providing an assembly output beam directed in an output direction along an assembly axis of the laser source assembly, the laser assembly comprising:
    a mounting base;
    a first quantum cascade emitter that emits a first beam in the output direction along a first beam axis, the first quantum cascade emitter being secured to the mounting base so that the first beam axis that is substantially parallel to and spaced apart from the assembly axis;
    a first lens that collimates the first beam, the first lens being coaxial with the first beam axis;
    a second quantum cascade emitter that emits a second beam in the output direction along a second beam axis, the second quantum cascade emitter being secured to the mounting base so that the second beam axis is substantially parallel to and spaced apart from the assembly axis;
    a second lens that collimates the second beam, the second lens being coaxial with the second beam axis;
    a third quantum cascade emitter that emits a third beam in the output direction along a third beam axis, the third quantum cascade emitter being secured to the mounting base so that the third beam axis is substantially parallel to and spaced apart from the assembly axis, wherein the first beam axis, the second beam axis and the third beam axis are positioned spaced apart about and substantially equidistant from the assembly axis;
    a third lens that collimates the third beam, the third lens being coaxial with the first beam axis; and
    a beam adjuster assembly positioned on the assembly axis that receives the first beam, the second beam and the third beam, wherein the first beam is non-folded and travels in only the output direction along the first beam axis between the first quantum cascade emitter and the beam adjuster assembly, wherein the second beam is non-folded and travels in only the output direction along the second beam axis between the second quantum cascade emitter and the beam adjuster assembly, and wherein the third beam is non-folded and travels in only the output direction along the third beam axis between the third quantum cascade emitter and the beam adjuster assembly.

2. The laser source assembly of claim 1 wherein the beam adjuster assembly that collectively expands the first, second, and third beams and subsequently collimates the first, second, and third beams.

3. The laser source assembly of claim 1 wherein the first beam includes a first set of wavelengths, the second beam includes a second set of wavelengths, and the third beam includes a third set of wavelengths, and wherein the first wavelength set is different from the second set of wavelengths and the third set of wavelengths.

4. The laser source assembly of claim 1 wherein the first beam includes a first set of wavelengths, the second beam includes a second set of wavelengths, and the third beam includes a third set of wavelengths, and wherein the first set of wavelengths is equal to the second set of wavelengths and the third set of wavelengths.

5. The laser source assembly of claim 1 further comprising a system controller that directs power to the first emitter, the second emitter and the third emitter to adjust a pulse width and a repetition rate of the assembly output beam.

6. A targeting assembly comprising a thermal imager that captures a thermal image, and the laser source assembly of claim 1.

7. A weapon assembly comprising a weapon and the targeting assembly of claim 6.

8. The laser source assembly of claim 1 wherein the beam adjuster assembly includes (i) a convex collimating diverging lens that diverges the first, second and third beams, and (ii) a concave collimating assembly lens that collimates the first, second, and third beams.

9. The laser source assembly of claim 1 further comprising a heat dissipater that transfers heat away from the mounting base.

10. The laser source assembly of claim 1 further comprising (i) a first heat sink that secures the first quantum cascade emitter to the mounting base, (ii) a second heat sink that secures the second quantum cascade emitter to the mounting base, and (iii) a third heat sink that secures the third quantum cascade emitter to the mounting base.

11. The laser source assembly of claim 1 further comprising (i) a first heat sink that secures the first quantum cascade emitter and the second quantum cascade emitter to the mounting base, and (ii) a second heat sink that secures the third quantum cascade emitter to the mounting base.

12. The laser source assembly of claim 1 wherein the mounting base includes a common heat sink that secures the first quantum cascade emitter, the second quantum cascade emitter, and the third quantum cascade emitter to the mounting base.

13. A laser source assembly for providing an assembly output beam directed in an output direction along an assembly axis of the laser source assembly, the laser source assembly comprising:
    a mounting base;
    a first quantum cascade emitter that emits a first beam in the output direction along a first beam axis, the first quantum cascade emitter being coupled to the mounting base so that the first beam axis is substantially parallel to and spaced apart from the assembly axis;

a first lens that collimates the first beam, the first lens being coaxial with the first beam axis;

a second quantum cascade emitter that emits a second beam in the output direction along a second beam axis that is substantially parallel to and spaced apart from the first beam axis, the second quantum cascade emitter being coupled to the mounting base so that the second beam axis is substantially parallel to and spaced apart from the assembly axis, wherein the first beam axis and the second beam axis are positioned substantially equidistant from the assembly axis;

a second lens that collimates the second beam, the second lens being coaxial with the second beam axis; and a beam adjuster assembly positioned on the assembly axis that diverges and subsequently collimates the first beam that exits the first lens and the second beam that exits the second lens; wherein the first beam travels along only the first beam axis between the first quantum cascade emitter and the beam adjuster assembly, and wherein the second beam travels along only the second beam axis between the second quantum cascade emitter and the beam adjuster assembly.

14. The laser source assembly of claim 13 wherein the beam adjuster assembly includes (i) a diverging lens that diverges the first beam that exits the first lens and the second beam that exits the second lens, and (ii) an assembly lens that collimates the first beam and the second beam exiting from the diverging lens.

15. The laser source assembly of claim 13 further comprising a third emitter that emits a third beam along a third beam axis that is substantially parallel to and spaced apart from the from the first beam axis and the second beam axis, and a third lens that collimates the third beam, and wherein the beam adjuster assembly diverges and subsequently collimates the third beam that exits the third lens.

16. The laser source assembly of claim 13 wherein the first beam includes a first set of wavelengths, and the second beam includes a second set of wavelengths that is different from the first set of wavelengths.

17. The laser source assembly of claim 13 wherein the first beam includes a first set of wavelengths, and the second beam includes a second set of wavelengths that is equal to the first set of wavelengths.

18. The laser source assembly of claim 13 further comprising a system controller that directs power to the first emitter and the second emitter to adjust a pulse width and a repetition rate of the assembly output beam.

19. A weapon assembly comprising a weapon, a thermal imager that captures a thermal image, the thermal imager being coupled to the weapon, and the laser source assembly of claim 13.

20. A thermal pointer assembly for use with a thermal imager to highlight a target for a weapon, the thermal pointer assembly including an assembly axis, the thermal pointer assembly comprising:

a thermal pointer comprising (i) a first quantum cascade emitter that emits a first beam in an output direction along a first beam axis that is substantially parallel to and spaced apart from the assembly axis; (ii) a second quantum cascade emitter that emits a second beam in the output direction along a second beam axis that is substantially parallel to and spaced apart from the first beam axis and the assembly axis; and (iii) a beam adjuster assembly positioned on the assembly axis that diverges and subsequently collimates the first beam and the second beam; wherein the first beam is non-folded and travels in only the output direction along the first beam axis between the first quantum cascade emitter and the beam adjuster assembly, and wherein the second beam is non-folded and travels in only the output direction along the second beam axis between the second quantum cascade emitter and the beam adjuster assembly; and a mount that secures the thermal pointer to the weapon.

21. The thermal pointer assembly of claim 20 wherein the first beam includes a first set of wavelengths, and the second beam includes a second set of wavelengths that is different from the first set of wavelengths.

22. The thermal pointer assembly of claim 20 wherein the first beam includes a first set of wavelengths, and the second beam includes a second set of wavelengths that is equal to the first set of wavelengths.

23. The thermal pointer assembly of claim 20 wherein the thermal pointer further comprises a third emitter that emits a third beam along a third beam axis that is substantially parallel to and spaced apart from the from the first beam axis and the second beam axis, and wherein the first beam axis, the second beam axis and the third beam axis are positioned substantially parallel to, spaced apart about and substantially equidistant from the assembly axis.

24. A weapon assembly comprising a weapon, a thermal imager that captures a thermal image, the thermal imager being coupled to the weapon, and the thermal pointer assembly of claim 20.

* * * * *